(12) United States Patent
Kumazawa

(10) Patent No.: US 11,373,907 B2
(45) Date of Patent: Jun. 28, 2022

(54) METHOD OF MANUFACTURING DEVICE CHIP

(71) Applicant: DISCO CORPORATION, Tokyo (JP)

(72) Inventor: Satoshi Kumazawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/704,674

(22) Filed: Dec. 5, 2019

(65) Prior Publication Data

US 2020/0185276 A1 Jun. 11, 2020

(30) Foreign Application Priority Data

Dec. 7, 2018 (JP) .............................. JP2018-230163

(51) Int. Cl.
| | |
|---|---|
| *H01L 21/78* | (2006.01) |
| *H01L 23/544* | (2006.01) |
| *B23K 26/38* | (2014.01) |
| *H01L 21/50* | (2006.01) |
| *H01L 21/683* | (2006.01) |

(52) U.S. Cl.
CPC .............. *H01L 21/78* (2013.01); *B23K 26/38* (2013.01); *H01L 21/50* (2013.01); *H01L 21/6835* (2013.01); *H01L 23/544* (2013.01)

(58) Field of Classification Search
CPC . H01L 21/78; H01L 21/6836; H01L 21/6835; H01L 23/544
See application file for complete search history.

(56) References Cited

U.S. PATENT DOCUMENTS

| | | | | |
|---|---|---|---|---|
| 2015/0159821 | A1* | 6/2015 | Arakawa | ................. H01L 21/78 216/24 |
| 2017/0047221 | A1* | 2/2017 | Harada | ................. H01L 21/304 |
| 2018/0212098 | A1* | 7/2018 | Okamura | ............ H01L 33/0095 |

FOREIGN PATENT DOCUMENTS

JP        04099607 A     3/1992

* cited by examiner

*Primary Examiner* — Dale E Page
*Assistant Examiner* — Wilner Jean Baptiste
(74) *Attorney, Agent, or Firm* — Greer Burns & Crain, Ltd.

(57) ABSTRACT

A method of manufacturing a device chip includes applying, from a front surface of a wafer formed with devices in a plurality of regions partitioned by a plurality of crossing division lines, a laser beam of such a wavelength as to be absorbed in the wafer along the division lines, to form V-shaped laser processed grooves along the division lines, the laser processed grooves becoming shallower toward outer sides in a width direction; adhering an adhesive tape to the front surface of the wafer formed with the laser processed grooves; and grinding the wafer held by a chuck table, with the adhesive tape interposed therebetween, from a back surface, to divide the wafer while thinning the wafer to a finished thickness, thereby forming a plurality of device chips having inclined surfaces at outside surfaces thereof.

5 Claims, 21 Drawing Sheets

METHOD OF MANUFACTURING DEVICE CHIP

BACKGROUND OF THE INVENTION

Field of the Invention

The present invention relates to a method of manufacturing a device chip.

Description of the Related Art

A semiconductor device chip is generally mounted on a mounting substrate such as a flat rigid substrate configured using glass epoxy. In recent years, however, flexible substrates rich in pliability or flexibility have come to be used as the mounting substrate. A flexible substrate is mounted to an organic electroluminescent (EL) panel having a curved surface or a sensor to be disposed along a human body. On the other hand, the applicant of the present invention has proposed a dicing technique in which, at the time of dividing a wafer into device chips, what is generally called step cutting is conducted that includes forming cut grooves by a cutting blade having a thick cutting edge and thereafter cutting the bottoms of the cut grooves by a cutting blade having a thin cutting edge (see, for example, Japanese Patent No. 2892459).

SUMMARY OF THE INVENTION

The device chip to be mounted on the flexible substrate mentioned above is required to have a higher die strength, since a force in a bending direction is necessarily exerted thereon. The dicing technique described in Japanese Patent No. 2892459 and the like tends to lower the die strength because chipping would be generated. Since the dicing technique particularly involves considerable chipping on the back surface side, the technique described in Japanese Patent No. 2892459 performs step cutting or the like; however, it is difficult to completely prevent chipping, and a problem still remains.

It is therefore an object of the present invention to provide a method of manufacturing a device chip that is able to enhance die strength of device chips.

In accordance with an aspect of the present invention, there is provided a method of manufacturing a device chip, the method including: a laser processed groove forming step of applying, from a front surface of a wafer formed with devices in a plurality of regions of the front surface partitioned by a plurality of crossing division lines, a laser beam of such a wavelength as to be absorbed in the wafer along the division lines, to form V-shaped laser processed grooves along the division lines, the laser processed grooves becoming shallower toward outer sides in a width direction; a protective member adhering step of adhering a protective member to the front surface of the wafer formed with the laser processed grooves; and a grinding step of grinding the wafer held by a chuck table, with the protective member interposed therebetween, from a back surface of the wafer, to divide the wafer while thinning the wafer to a finished thickness, thereby forming a plurality of device chips having inclined surfaces at side surfaces thereof.

Preferably, the method of manufacturing the device chip further includes a plasma etching step of plasma etching the device chips held by the protective member after the grinding step is carried out.

Preferably, the method of manufacturing the device chip further includes a groove forming step of forming cut grooves having a depth in excess of a thickness of the device chips along the laser processed grooves by a cutting blade, after the laser processed groove forming step is carried out but before the protective member adhering step is carried out, in which, in the grinding step, grinding is conducted until the cut grooves are exposed to the back surface.

Preferably, the device chip is a device chip to be mounted on a flexible substrate formed with wiring and electrodes.

In accordance with another aspect of the present invention, there is provided a method of manufacturing a device chip, the method including: a protective member adhering step of adhering a protective member to a front surface of a wafer formed with devices in a plurality of regions of the front surface partitioned by a plurality of crossing division lines; a grinding step of grinding the wafer with the protective member adhered thereto from a back surface side, to thin the wafer to a finished thickness; and a laser processing step of applying a laser beam of such a wavelength as to be absorbed in the wafer from the front surface or the back surface of the wafer along the division lines, to form V-shaped laser processed grooves along the division lines, the laser processed grooves becoming shallower toward outer sides in a width direction, and to form a plurality of device chips having inclined surfaces at side surfaces thereof, after the grinding step is carried out.

Preferably, the method of manufacturing the device chip further includes a plasma etching step of plasma etching the device chips held by the protective member, after the laser processing step is carried out.

Preferably, the method of manufacturing the device chip further includes a groove forming step of forming cut grooves for dividing the wafer along the laser processed grooves by a cutting blade, after the laser processing step is carried out.

Preferably, the device chip is a device chip to be mounted on a flexible substrate formed with wiring and electrodes.

The method of manufacturing the device chip of the present invention produces an effect such that die strength of device chips can be enhanced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described in detail below with reference to the drawings. The present invention is not to be limited by the contents described in the following embodiments. Further, in the constituent elements described below, those which are easily conceivable by those skilled in the art and those which are substantially identical or equivalent thereto are included. Moreover, configurations described below can be combined as required. In addition, various kinds of omission, replacement, or change can be made without departing from the scope of the present invention.

First Embodiment

Figure 1:
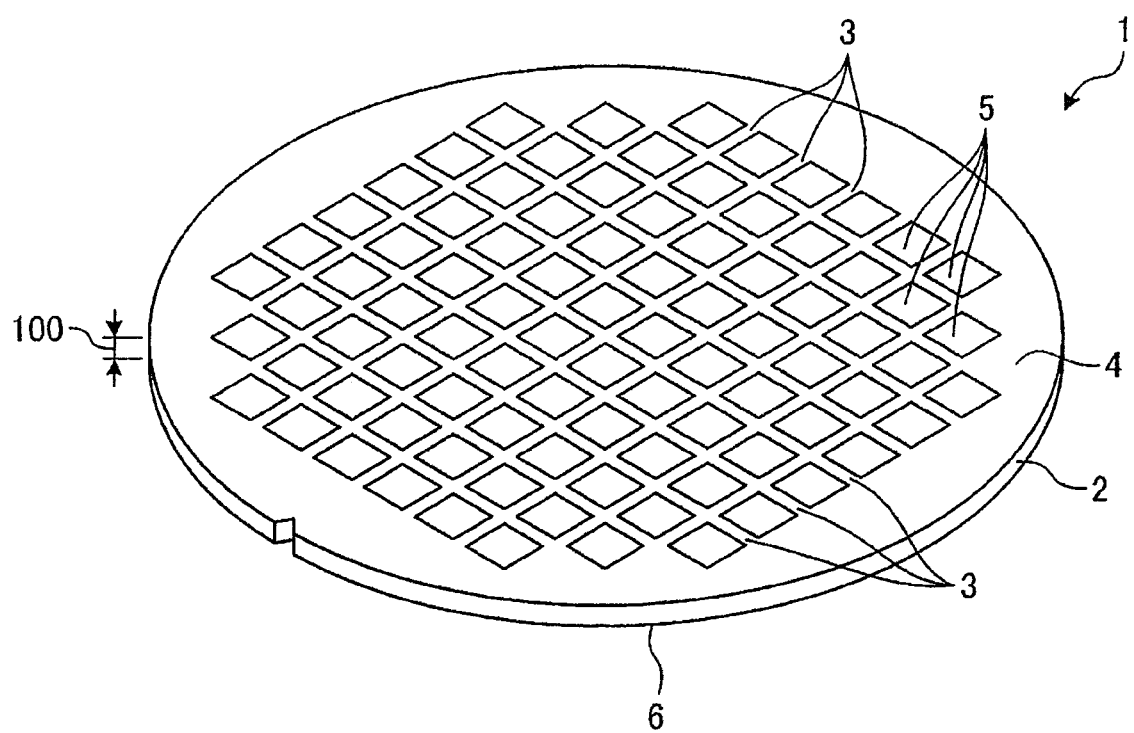
FIG. 1 is a perspective view illustrating one example of a wafer to be processed by a method of manufacturing a device chip according to a first embodiment.
Figure 2:
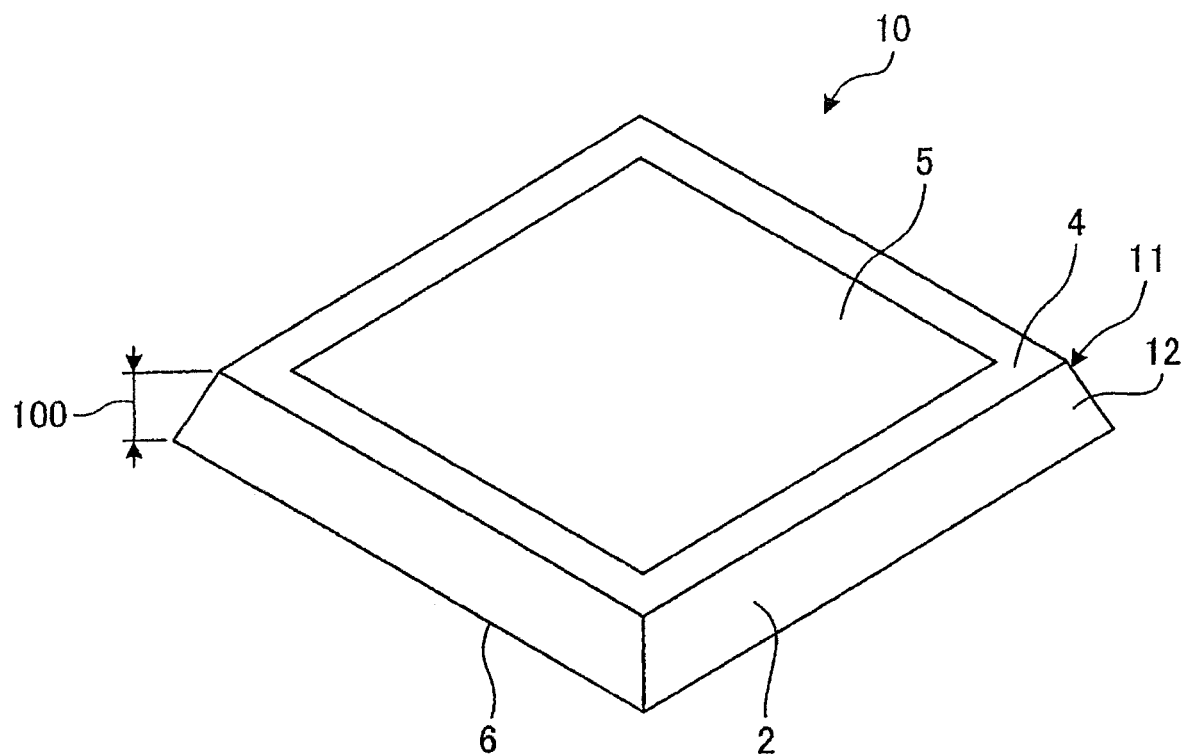
FIG. 2 is a perspective view of a device chip manufactured by the method of manufacturing the device chip according to the first embodiment.
Figure 3:
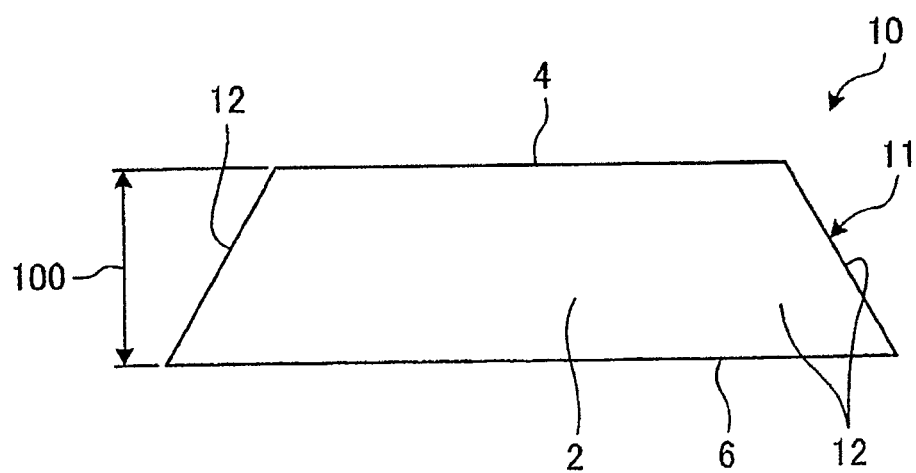
FIG. 3 is a side view of the device chip illustrated in FIG. 2.
Figure 4:
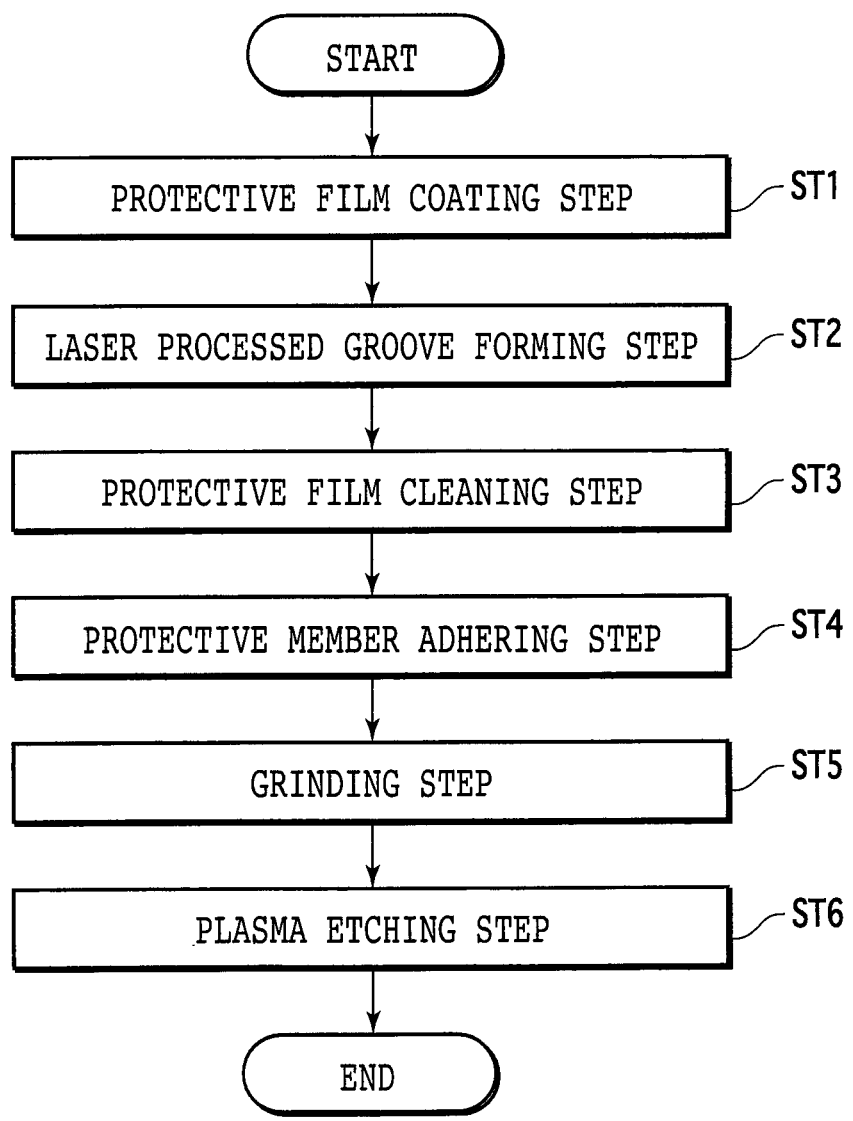
FIG. 4 is a flow chart depicting the flow of the method of manufacturing the device chip according to the first embodiment.

A method of manufacturing a device chip according to a first embodiment of the present invention will be described referring to the drawings. FIG. 1 is a perspective view illustrating one example of a wafer to be processed by the method of manufacturing the device chip according to the first embodiment. FIG. 2 is a perspective view of a device chip manufactured by the method of manufacturing the device chip according to the first embodiment. FIG. 3 is a side view of the device chip illustrated in FIG. 2. FIG. 4 is a flow chart depicting the flow of the method of manufacturing the device chip according to the first embodiment.

The method of manufacturing the device chip according to the first embodiment is a method of dividing a wafer 1 illustrated in FIG. 1 on the basis of individual devices 5, to manufacture device chips 10 depicted in FIGS. 2 and 3. In the first embodiment, the wafer 1 is a disk-shaped semiconductor wafer or an optical device wafer with a substrate 2 including silicon, sapphire, or gallium arsenide. As depicted in FIG. 1, the wafer 1 is formed with the devices 5 respectively in a plurality of regions of a front surface 4 of the substrate 2 partitioned by a plurality of crossing division lines 3.

The device 5 is, for example, an integrated circuit such as an integrated circuit (IC) and a large scale integration (LSI), or an image sensor such as a charge coupled device (CCD) or a complementary metal oxide semiconductor (CMOS). As illustrated in FIG. 2, the device chip 10 individually divided from the wafer 1 includes a part of the substrate 2 and the device 5 formed at the front surface 4 of the substrate 2. Note that, in the description of the device chip 10 of the present invention, those parts which are common with the wafer 1 are denoted by the same reference symbols in the description.

In the first embodiment, of the device chip 10, outside surfaces 11 of the substrate 2 are inclined surfaces 12 inclined relative to the front surface 4 and a back surface 6 in such a direction that the plan-view shape of the substrate 2 is enlarged from the front surface 4 toward the back surface 6. In the first embodiment, the inclined surfaces 12 are formed to be flat. In addition, in the first embodiment, the device chip 10, by being mounted on a flexible substrate, is used, for example, for an organic EL panel having a curved surface or a flexible electronic apparatus such as a sensor to be disposed along a human body.

The flexible substrate includes a substrate having flexibility, which is formed with wiring and electrodes. The substrate is a sheet or a film configured using a flexible resin, and a region, on which to mount the device chip 10 to be connected to the wiring, is set thereon. The wiring and electrodes are configured using a conductive metal or the like, and are disposed on or in the substrate according to a predetermined pattern. In addition, of the wiring and electrodes, parts may be electrically connected to electrodes (not illustrated) of the device chip 10, and parts other than the parts connected to the electrodes of the device chips 10 may be embedded in the substrate.

The method of manufacturing the device chip according to the first embodiment is a method in which the wafer 1 is divided along the division lines 3 into the individual device chips 10, and the device chips 10 are thinned to a predetermined finished thickness 100 (depicted in FIG. 1, etc.). As depicted in FIG. 4, the method of manufacturing the device chip includes a protective film coating step ST1, a laser processed groove forming step ST2, a protective film cleaning step ST3, a protective member adhering step ST4, a grinding step ST5, and a plasma etching step ST6.

(Protective Film Coating Step)

Figure 5:
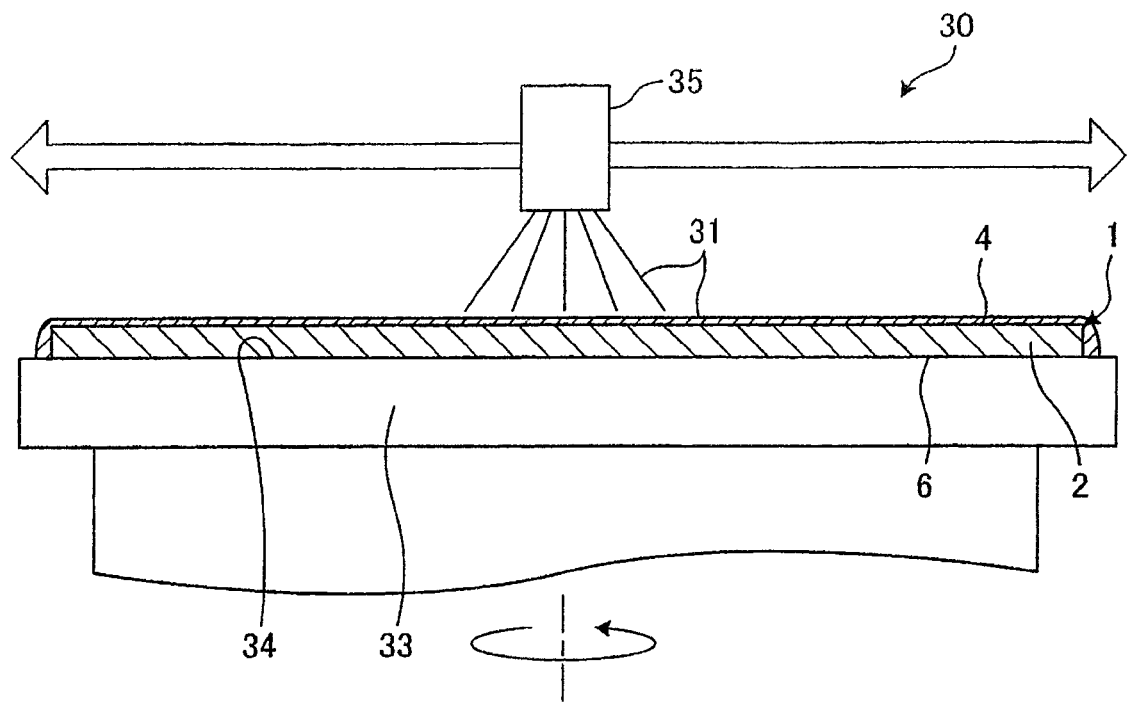
FIG. 5 is a side view depicting, partly in section, a protective film coating step of the method of manufacturing the device chip depicted in FIG. 4.

FIG. 5 is a side view depicting, partly in section, the protective film coating step of the method of manufacturing the device chip depicted in FIG. 4. The protective film coating step ST1 is a step of supplying a water-soluble resin 31 to the front surface 4 of the wafer 1 before the laser processed groove forming step ST2, to coat the front surface 4 of the wafer 1 with a water-soluble protective film 32 (illustrated in FIG. 6) formed of the cured water-soluble resin 31.

In the protective film coating step ST1, as illustrated in FIG. 5, a protective film coating apparatus 30 holds under suction the back surface 6 side of the wafer 1 on a holding surface 44 of a spinner table 33, and, while rotating the spinner table 33 around an axis, the liquid water-soluble resin 31 is applied to the front surface 4 side of the wafer 1 from an applying nozzle 35 which is moved over the wafer 1 along the front surface 4. The water-soluble resin 31 includes a water-soluble liquid resin such as polyvinyl alcohol (PVA) and polyvinyl pyrrolidone (PVP), or the like. The water-soluble resin 31 applied to the front surface 4 of the wafer 1 is spread to an outer edge side of the wafer 1 by a centrifugal force generated by the rotation of the spinner table 33, to cover the whole part of the front surface 4 of the wafer 1.

In the protective film coating step ST1, after the protective film coating apparatus 30 applies the water-soluble resin 31 to the front surface 4 side of the wafer 1, the water-soluble resin 31 is dried or heated, to be cured, whereby the whole part of the front surface 4 of the wafer 1 is coated with the water-soluble protective film 32. When the whole part of the front surface 4 of the wafer 1 is coated with the water-soluble protective film 32, the method of manufacturing the device chip proceeds to the laser processed groove forming step ST2.

(Laser Processed Groove Forming Step)

Figure 6:
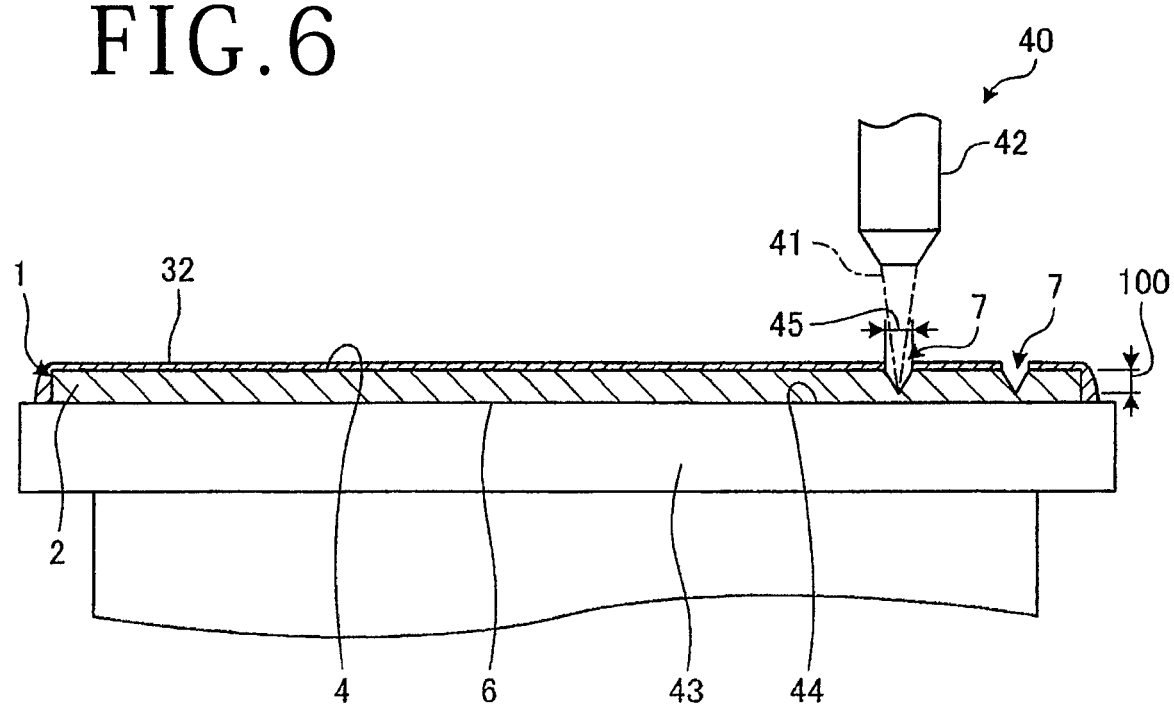
FIG. 6 is a side view depicting, partly in section, a laser processed groove forming step of the method of manufacturing the device chip depicted in FIG. 4.

FIG. 6 is a side view depicting, partly in section, the laser processed groove forming step of the method of manufacturing the device chip depicted in FIG. 4. The laser processed groove forming step ST2 is a step in which a laser beam 41 of such a wavelength as to be absorbed in the wafer 1 is applied from the front surface 4 of the wafer 1 along the division lines 3, to form sectionally V-shaped laser processed grooves 7 along the division lines 3, the laser processed grooves 7 becoming shallower toward with-directional outer sides.

In the laser processed groove forming step ST2, as illustrated in FIG. 6, the back surface 6 side of the wafer 1 is held under suction on a holding surface 44 of a chuck table 43 of a laser processing apparatus 40. In the laser processed groove forming step ST2, an imaging unit (not illustrated) of the laser processing apparatus 40 images the front surface 4 of the wafer 1 to detect the division lines 3, and alignment between the wafer 1 and a laser beam applying unit 42 is performed.

In the laser processed groove forming step ST2, the laser processing apparatus 40 applies a pulsed laser beam 41 of such a wavelength as to be absorbed in the wafer 1 along each of the division lines 3 while moving the laser beam applying unit 42 along the division line 3 relatively to the chuck table 43. In the laser processed groove forming step ST2 in the first embodiment, at the time of applying the laser beam 41 from the laser beam applying unit 42 while moving the laser beam applying unit 42 along the division line 3 relatively to the chuck table 43, the laser processing apparatus 40 also scans the laser beam 41 in a width direction 45 of each division line 3. Note that the laser processing apparatus 40 includes a polygon mirror, a Galvano scanner, or the like for scanning the laser beam 41 in the width direction 45 of each division line 3.

In the laser processed groove forming step ST2, as illustrated in FIG. 6, the laser processing apparatus 40 subjects the division line 3 on the front surface 4 of the wafer 1 to ablation, to form the laser processed groove 7 along the division line 3. Debris (not illustrated) generated upon the ablation adheres to the water-soluble protective film 32. Note that, in the laser processed groove forming step ST2 in the first embodiment, the laser processing apparatus 40 forms the laser processed grooves 7 whose depth from the front surface 4 to the bottom thereof exceeds the finished thickness 100.

Besides, in the laser processed groove forming step ST2 in the first embodiment, the laser processing apparatus 40 applies the pulsed laser beam 41 along the longitudinal direction of the division line 3 while scanning the pulsed laser beam 41 in the width direction 45 of the division line 3, to form the laser processed groove 7 along the division line 3. In this instance, the pulses of the laser beam 41 are applied in the largest number to the center in the width direction of each division line 3, and the number of pulses of the laser beam 41 to be applied is decreased toward outer sides in a width direction of each division line 3. For this reason, in the laser processed groove forming step ST2 in the first embodiment, the sectionally V-shaped laser processed grooves 7 each becoming shallower toward the outer sides in the width direction of each division line 3 are formed.

Note that, in the first embodiment, inside surfaces of the laser processed groove 7 are formed to be flat, but, in the present invention, the inside surfaces may not be flat. In other words, the expression "sectionally V-shaped" as used in the present invention means that the laser processed groove 7 is gradually decreased in width in going toward the bottom thereof. When the laser processed grooves 7 have been formed along all the division lines 3 of the wafer 1, the method of manufacturing the device chip proceeds to the protective film cleaning step ST3.

(Protective Film Cleaning Step)

Figure 7:
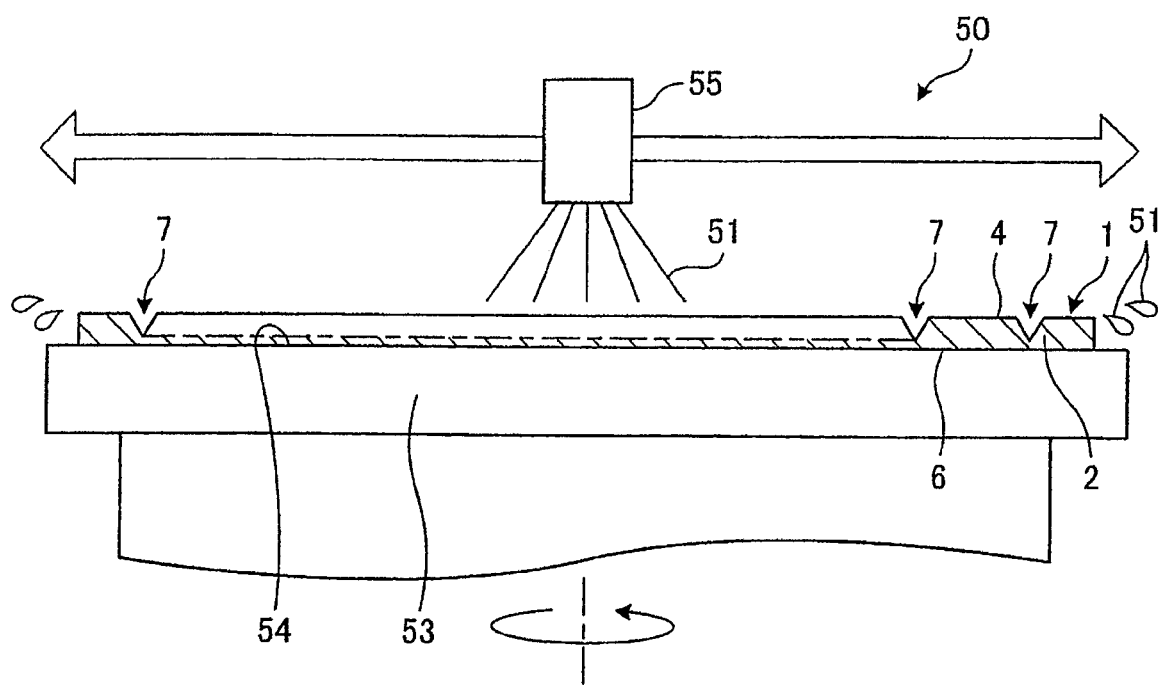
FIG. 7 is a side view depicting, partly in section, a protective film cleaning step of the method of manufacturing the device chip depicted in FIG. 4.

FIG. 7 is a side view depicting, partly in section, the protective film cleaning step of the method of manufacturing the device chip depicted in FIG. 4. The protective film cleaning step ST3 is a step in which, after the laser processed groove forming step ST2 is carried out, cleaning water 51 including pure water is supplied to the front surface 4 of the wafer 1, to remove the water-soluble protective film 32 together with debris generated upon ablation.

In the protective film cleaning step ST3, as illustrated in FIG. 7, a cleaning apparatus 50 holds under suction the back surface 6 side of the wafer 1 on a holding surface 54 of a spinner table 53, rotates the spinner table 53 around an axis, and jets the cleaning water 51 toward the front surface 4 of the wafer 1 from a cleaning water nozzle 55 which is moved over the wafer 1 along the front surface 4. In the protective film cleaning step ST3, the cleaning water 51 smoothly flows on the front surface 4 of the wafer 1 due to a centrifugal force generated by the rotation of the spinner table 53, to wash away and remove the debris adhering to the water-soluble protective film 32 together with the water-soluble protective film 32. In the protective film cleaning step ST3, when the cleaning apparatus 50 supplies the cleaning water 51 to the front surface 4 of the wafer 1 while rotating the spinner table 53, for a predetermined period of time, cleaning of the wafer 1 is finished, and the wafer 1 is dried. When drying of the front surface 4 of the wafer 1 is finished, the method of manufacturing the device chip proceeds to the protective member adhering step ST4.

Note that, in the first embodiment, the protective film coating step ST1 is conducted by the protective film coating apparatus 30 and the protective film cleaning step ST3 is performed by the cleaning apparatus 50 different from the protective film coating apparatus 30, but, in the present invention, the protective film coating step ST1 and the protective film cleaning step ST3 may be performed by a single apparatus including the nozzles 35 and 55.

(Protective Member Adhering Step)

Figure 8:
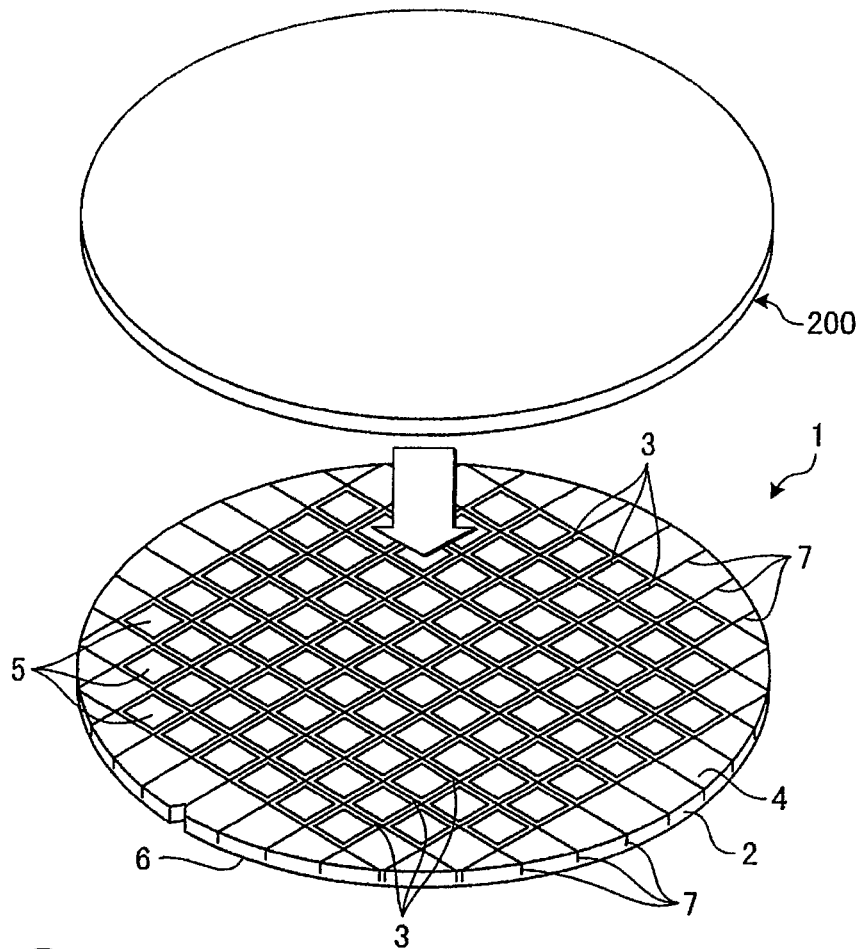
FIG. 8 is a perspective view illustrating a state in which an adhesive layer of an adhesive tape is made to face a front surface of a wafer, in the protective member adhering step of the method of manufacturing the device chip depicted in FIG. 4.
Figure 9:
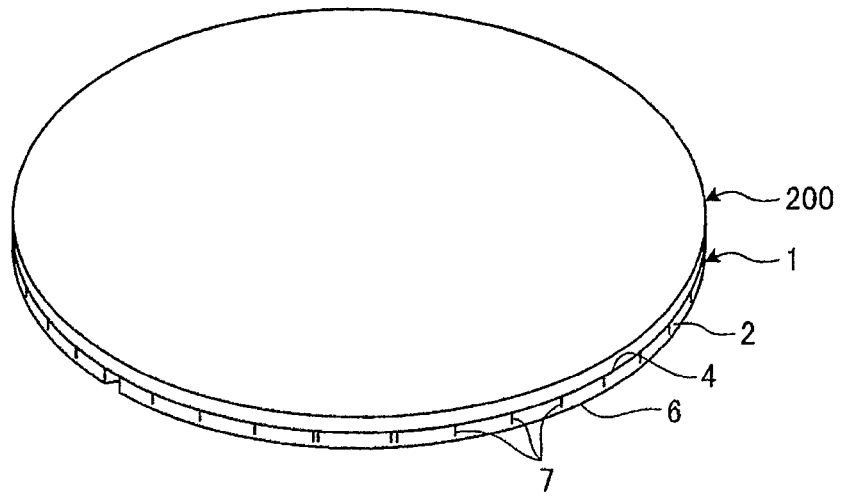
FIG. 9 is a perspective view illustrating a state in which the adhesive tape has been adhered to the front surface of the wafer, in the protective member adhering step of the method of manufacturing the device chip depicted in FIG. 4.

FIG. 8 is a perspective view illustrating a state in which an adhesive layer of an adhesive tape is made to face the front surface of the wafer, in the protective member adhering step of the method of manufacturing the device chip depicted in FIG. 4. FIG. 9 is a perspective view illustrating a state in which the adhesive tape has been adhered to the front surface of the wafer, in the protective member adhering step of the method of manufacturing the device chip depicted in FIG. 4.

The protective member adhering step ST4 is a step of adhering an adhesive tape 200 as a protective member to the front surface 4 of the wafer 1 formed with the laser processed grooves 7. In the protective member adhering step ST4 in the first embodiment, as illustrated in FIG. 8, the adhesive layer of the adhesive tape 200 equal in diameter with the wafer 1 is made to face the front surface 4 of the wafer 1, after which the adhesive tape 200 is adhered to the front surface 4 of the wafer 1 as depicted in FIG. 9. In the first embodiment, the adhesive tape 200 is used as the protective member, but, in the present invention, the protective member is not limited to the adhesive tape 200. When the adhesive tape 200 has been adhered to the front surface 4 of the wafer 1, the method of manufacturing the device chip proceeds to the grinding step ST5.

(Grinding Step)

Figure 10:
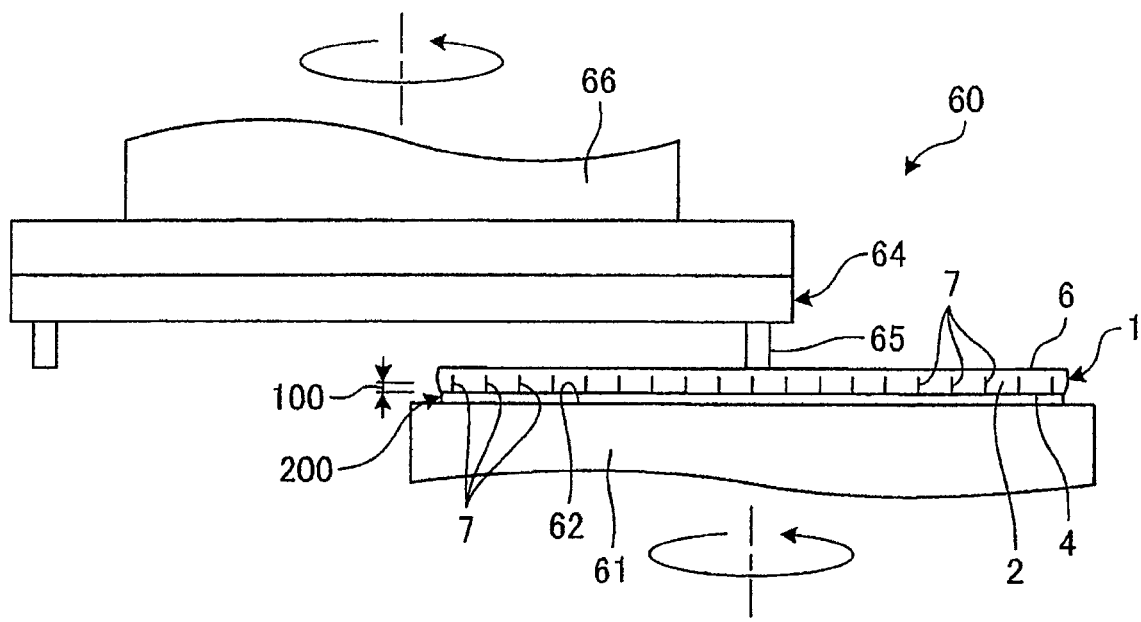
FIG. 10 is a side view depicting a grinding step of the method of manufacturing the device chip depicted in FIG. 4.

FIG. 10 is a side view depicting the grinding step of the method of manufacturing the device chip depicted in FIG. 4. The grinding step ST5 is a step of grinding the wafer 1 held by a chuck table 61 of a grinding apparatus 60, with the adhesive tape 200 interposed therebetween, from the back surface 6, to divide the wafer 1 while thinning the wafer 1 to the finished thickness 100, thereby forming the device chips 10 having inclined surfaces 12 at outside surfaces 11 thereof.

In the grinding step ST5, the grinding apparatus 60 holds under suction the front surface 4 side of the wafer 1 on a holding surface 62 of the chuck table 61, with the adhesive tape 200 interposed therebetween. In the grinding step ST5, as illustrated in FIG. 10, the grinding apparatus 60 supplies grinding water while rotating a grinding wheel 64 by a spindle 63 and rotating the chuck table 61 around an axis, and brings a grindstone 65 of the grinding wheel 64 closer to the chuck table 61 at a predetermined feed speed, thereby grinding the back surface 6 side of the wafer 1 by the grindstone 65. In the grinding step ST5, the grinding apparatus 60 grinds the wafer 1 until the finished thickness 100 is reached. When the wafer 1 is ground to the finished thickness 100 in the grinding step ST5, the laser processed grooves 7 are exposed to the back surface 6 side because the laser processed grooves 7 have a depth in excess of the finished thickness 100, whereby the wafer 1 is divided by the laser processed grooves 7 into the individual device chips 10.

When the wafer 1 has been thinned to the finished thickness 100, the method of manufacturing the device chip proceeds to the plasma etching step ST6. Note that, in the laser processed groove forming step ST2 in the first embodiment, the sectionally V-shaped laser processed grooves 7 having flat inside surfaces are formed, and, therefore, the device chip 10 has, at outside surfaces 11 thereof, flat inclined surfaces 12 such that the device chip 10 is gradually enlarged from the front surface 4 toward the back surface 6.

(Plasma Etching Step)

Figure 11:
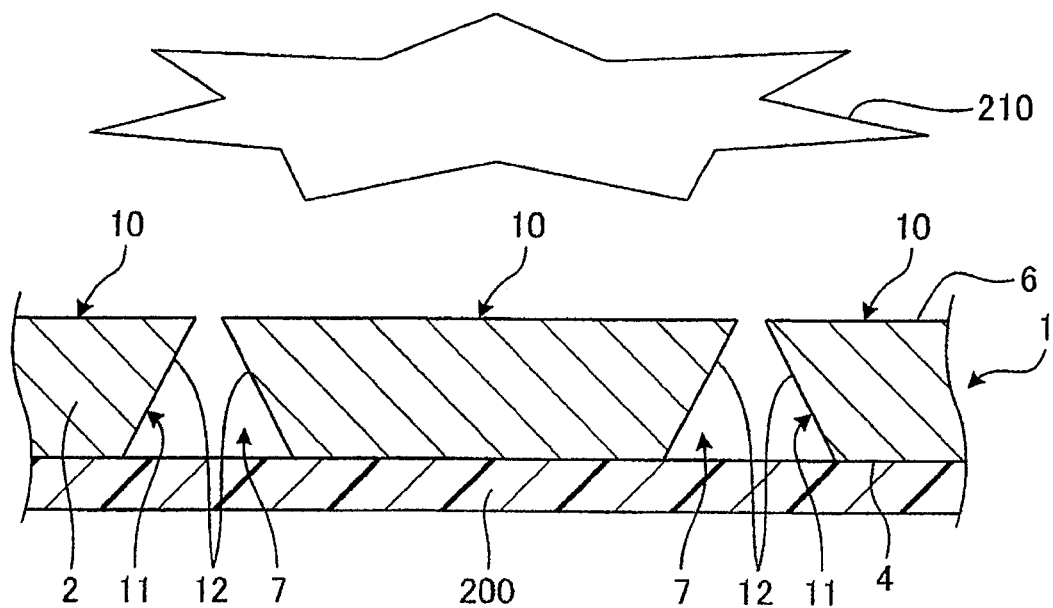
FIG. 11 is a sectional view of a major part of the wafer, depicting schematically a plasma etching step of the method of manufacturing the device chip depicted in FIG. 4.

FIG. 11 is a sectional view of a major part of a wafer, depicting schematically the plasma etching step of the method of manufacturing the device chip depicted in FIG. 4. The plasma etching step ST6 is a step of plasma etching the plurality of device chips 10 held by the adhesive tape 200, after the grinding step ST5 is carried out.

In the plasma etching step ST6, the plurality of device chips 10 held by the adhesive tape 200 are accommodated in an etching chamber of a plasma apparatus (not illustrated), and the front surface 4 side of the device chips 10 is electrostatically attracted to an electrostatic chuck table, with the adhesive tape 200 interposed therebetween. In the plasma etching step ST6, plasmatized gas is supplied into the etching chamber of an etching apparatus, whereby plasmatized etching gas 210 is supplied to the back surface 6 side of the wafer 1, as illustrated in FIG. 11.

Note that, in the plasma etching step ST6 in the first embodiment, an etching apparatus of what is generally called a remote plasma system in which the etching gas 210 plasmatized in the outside of the etching chamber is introduced into the etching chamber is used. In the present invention, however, an etching apparatus of what is generally called a direct plasma system may be used in which etching gas before plasmatization is supplied into the etching chamber from an upper electrode, and high frequency electric power is impressed on the electrodes, to plasmatize the etching gas in the etching chamber. In addition, in the first embodiment, in the case where the substrate 2 is configured using silicon, there is used $SF_6$, $C_4F_8$, $CF_4$, or the like as an etching gas, but the etching gas is not limited to these.

In the plasma etching step ST6, the etching apparatus performs plasma etching on the device chips 10 for a predetermined period of time required for removal of thermally influenced layers generated in the wafers 1, or in the device chips 10, in the laser processed groove forming step ST2 and crushed layers formed in the grinding step ST5. The method of manufacturing the device chip is finished when plasma etching and the like have been performed on the device chips 10. Note that, thereafter, the device chips 10 are picked up from the adhesive tape 200 by a pick-up device (not illustrated).

In the laser processed groove forming step ST2 in the method of manufacturing the device chip according to the first embodiment, the pulsed laser beam 41 is applied while being scanned in the width direction 45 of each division line 3, to form the sectionally V-shaped laser processed grooves 7, thereby forming the inclined surfaces 12 at the outside surfaces 11 of the device chips 10. This chip shape makes it possible to enhance die strength of the device chips 10. Further, since chipping is not generated in the laser processing, the die strength can be enhanced.

In addition, the method of manufacturing the device chip according to the first embodiment includes the plasma etching step ST6 of plasma etching the device chips 10, after the grinding step ST5. Therefore, thermally influenced layers generated in the laser processed groove forming step ST2 can be removed, and the die strength of the device chips 10 can be enhanced.

Besides, in the plasma etching step ST6 in the method of manufacturing the device chip according to the first embodiment, the plasma etching apparatus of the remote plasma system is used. Therefore, ions mixing into the plasmatized etching gas collide against an inner surface of a supply pipe and can be restrained from reaching the hermetically sealed space in the etching chamber, so that etching gas containing radicals in high concentration can be supplied. Accordingly, the device chips 10 can be plasma etched, even where the width of the laser processed grooves 7, i.e., the spacing between the device chips 10, is narrower.

(Modification)

Figure 12:
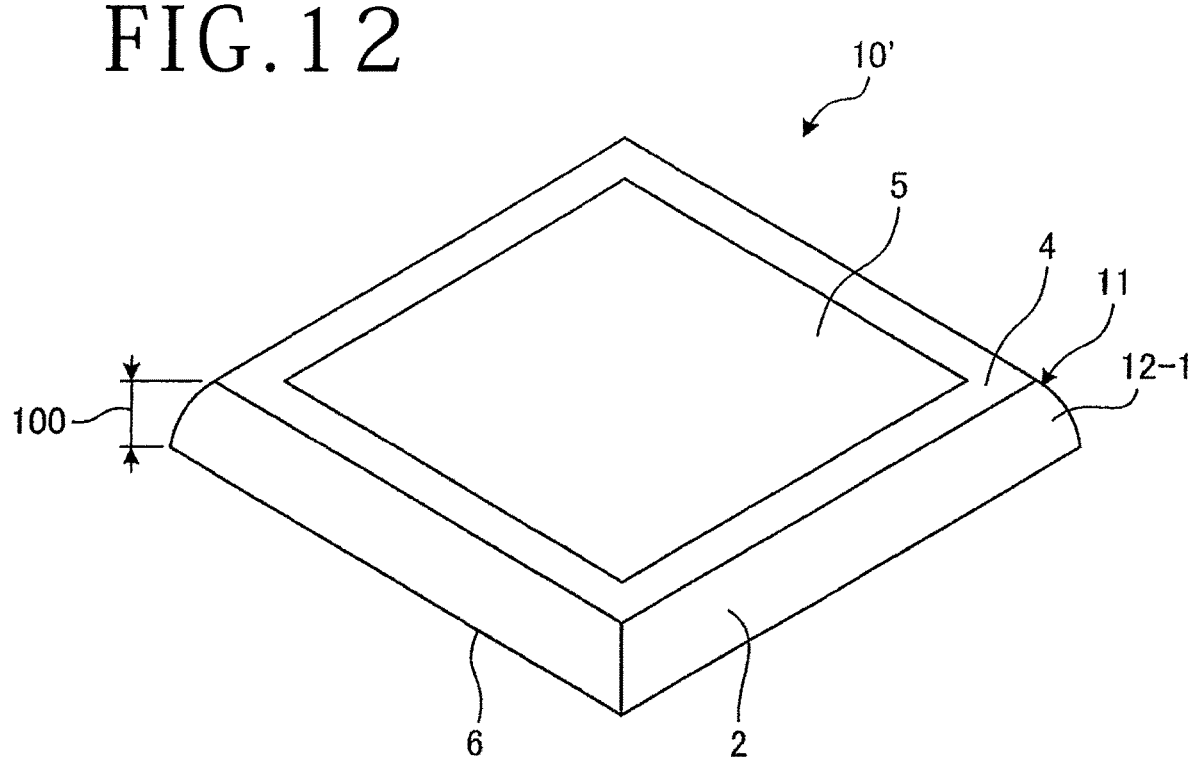
FIG. 12 is a perspective view of a device chip manufactured by a method of manufacturing a device chip according to a modification of a first embodiment and a second embodiment.
Figure 13:
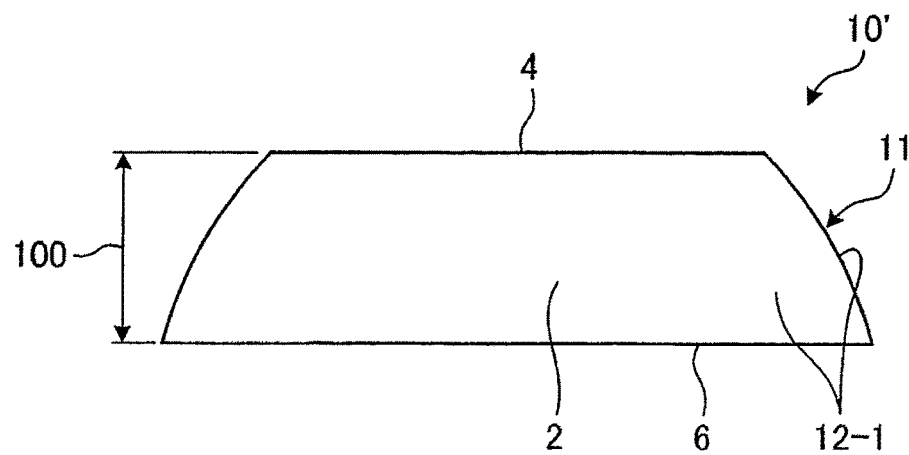
FIG. 13 is a side view of the device chip depicted in FIG. 12.

A method of manufacturing a device chip according to a modification of the first embodiment of the present invention will be described referring to the drawings. FIG. 12 is a perspective view of a device chip manufactured by the method of manufacturing the device chip according to the modification of the first embodiment. FIG. 13 is a side view of the device chip depicted in FIG. 12. Note that, in FIGS. 12 and 13, the same parts as those in the first embodiment above are denoted by the same reference symbols as used above, and descriptions thereof are omitted.

The method of manufacturing the device chip according to the modification of the first embodiment manufactures a device chip 10' illustrated in FIGS. 12 and 13 which has, at outside surfaces 11 thereof, curved surface shaped inclined surfaces 12-1 inclined relative to the front surface 4 and the back surface 6 while being curved to be protuberant toward the outside. In short, in the present invention, it is sufficient for the laser processed grooves 7 formed in the laser processed groove forming step ST2 to be formed to be reduced in width in going toward the bottom thereof.

In the laser processed groove forming step ST2 in the method of manufacturing the device chip according to the modification, the pulsed laser beam 41 is applied along the longitudinal direction of each division line 3 while being scanned in the width direction 45 of each division line 3. In this instance, by controlling the scanning in the width direction 45, the laser processed groove 7 having a section curved to be protuberant toward the outside of the device chip 10' is formed, and, therefore, the die strength of the device chip 10' can be enhanced, as in the first embodiment.

Second Embodiment

Figure 14:
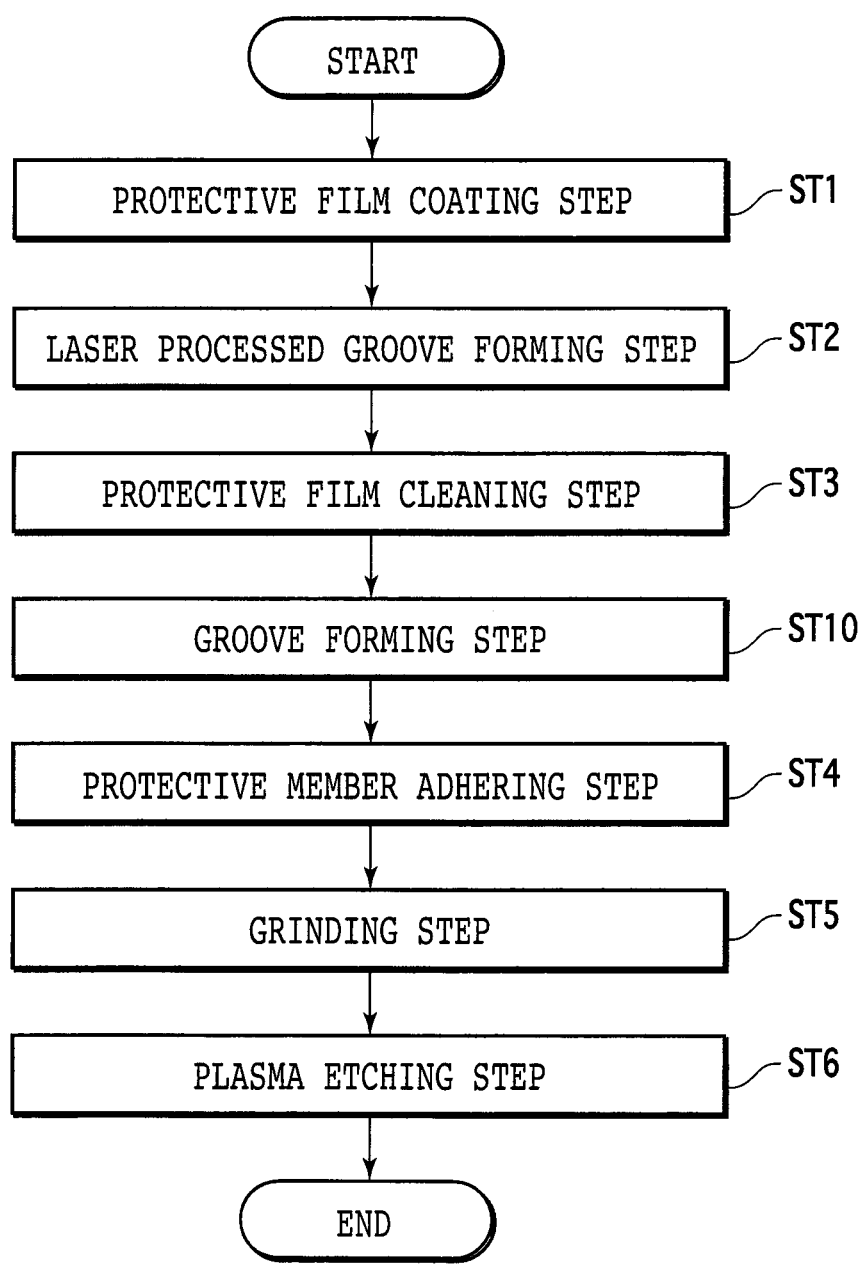
FIG. 14 is a flow chart depicting the flow of the method of manufacturing the device chip according to the second embodiment.
Figure 15:
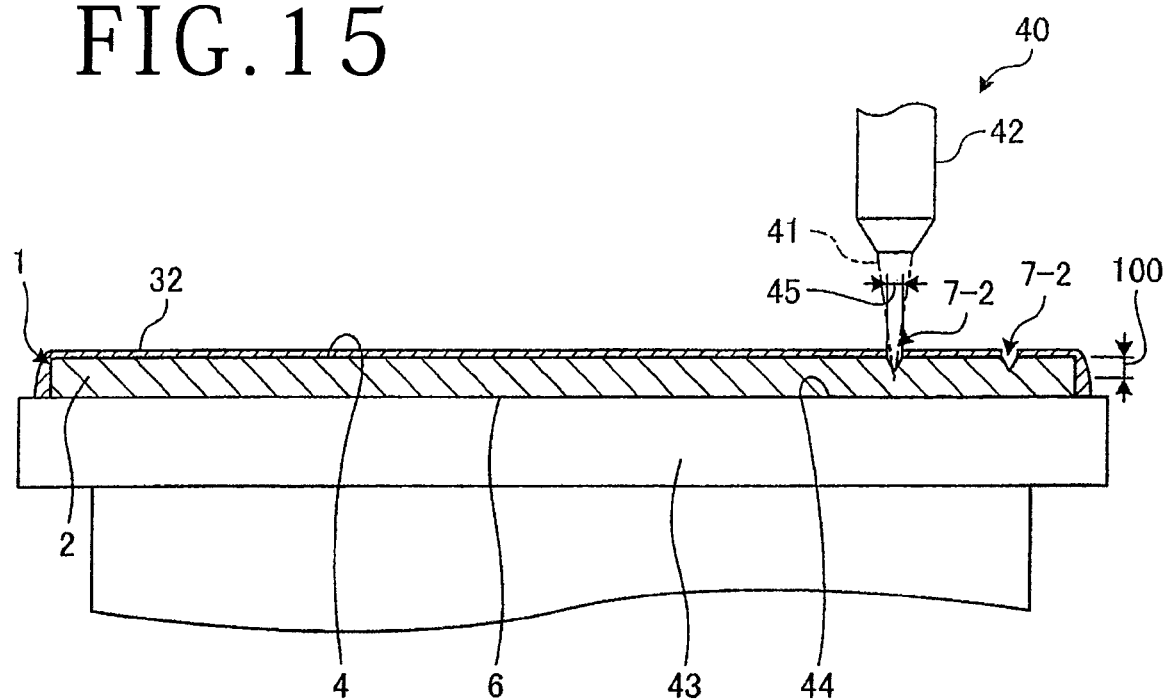
FIG. 15 is a side view depicting, partly in section, a laser processed groove forming step of the method of manufacturing the device chip depicted in FIG. 14.
Figure 16:
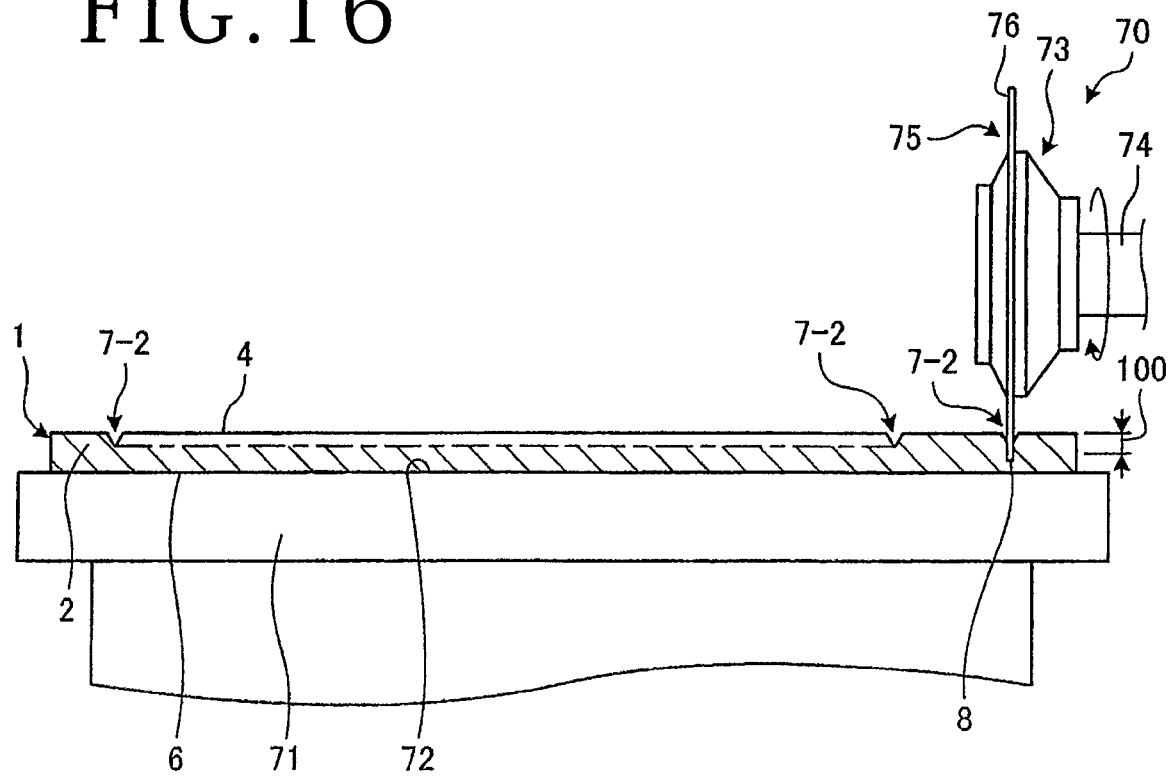
FIG. 16 is a side view depicting, partly in section, a groove forming step of the method of manufacturing the device chip depicted in FIG. 14.
Figure 17:
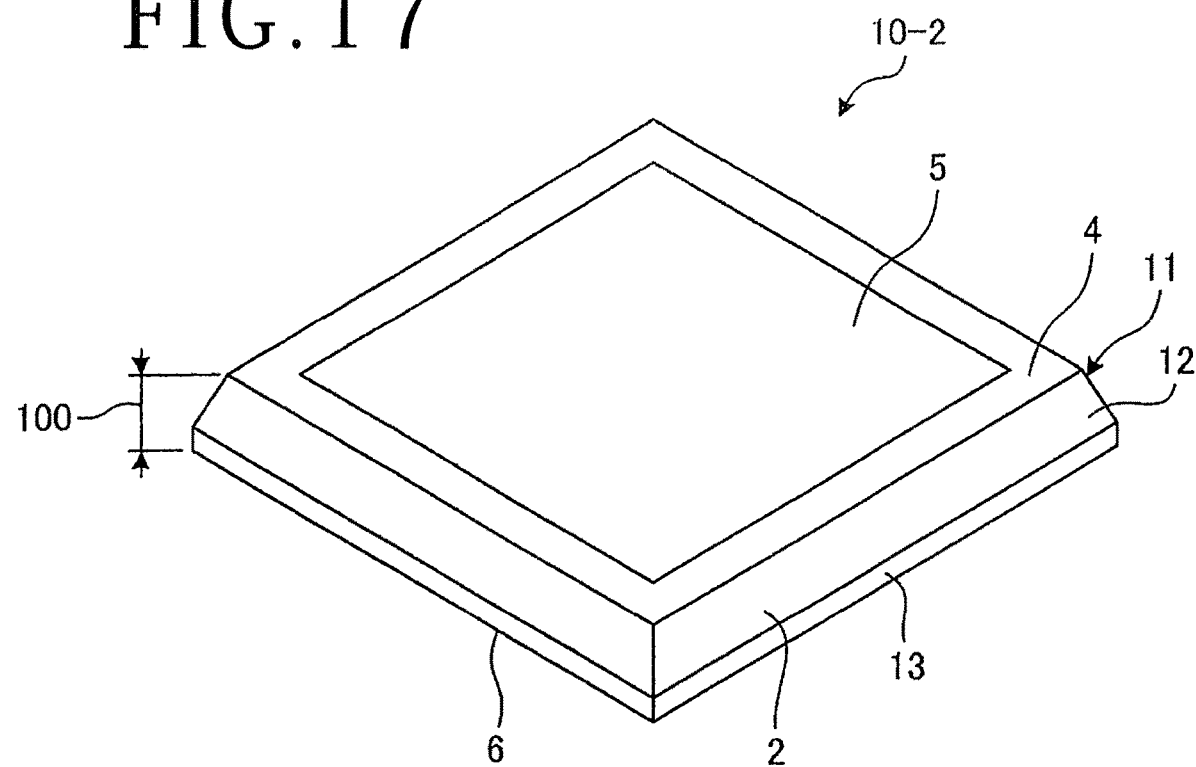
FIG. 17 is a perspective view of a device chip manufactured by the method of manufacturing the device chip depicted in FIG. 14.
Figure 18:
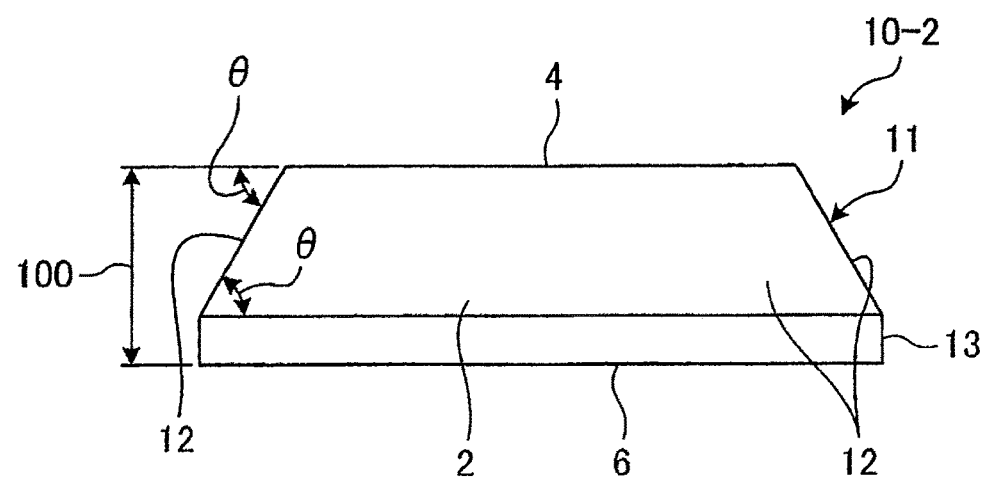
FIG. 18 is a side view of the device chip depicted in FIG. 17.

A method of manufacturing a device chip according to a second embodiment of the present invention will be described referring to the drawings. FIG. 14 is a flow chart depicting the flow of the method of manufacturing the device chip according to the second embodiment. FIG. 15 is a side view depicting, partly in section, a laser processed groove forming step of the method of manufacturing the device chip depicted in FIG. 14. FIG. 16 is a side view depicting, partly in section, a groove forming step of the method of manufacturing the device chip depicted in FIG. 14. FIG. 17 is a perspective view of a device chip manufactured by the method of manufacturing the device chip depicted in FIG. 14. FIG. 18 is a side view of the device chip depicted in FIG. 17. Note that in FIGS. 14 to 18, the same parts as those in the first embodiment above are denoted by the same reference symbols as used above, and descriptions thereof are omitted.

The method of manufacturing the device chip according to the second embodiment is a method in which, as in the first embodiment, a wafer 1 is divided along division lines 3 into individual device chips 10-2, and the device chips 10-2 are thinned to a predetermined finished thickness 100 set in advance. As depicted in FIG. 14, the method of manufacturing the device chip according to the second embodiment includes a groove forming step ST10 in addition to a protective film coating step ST1, a laser processed groove forming step ST2, a protective film cleaning step ST3, a protective member adhering step ST4, a grinding step ST5, and a plasma etching step ST6.

In the laser processed groove forming step ST2 of the method of manufacturing the device chip according to the second embodiment, as illustrated in FIG. 15, a laser processing apparatus 40 forms laser processed grooves 7-2 whose depth from a front surface 4 of a wafer 1 to the bottom thereof is smaller than the finished thickness 100.

The groove forming step ST10 of the method of manufacturing the device chip according to the second embodiment is a step of forming cut grooves 8 having a depth in excess of the finished thickness 100, which is the thickness of the device chips 10-2, by a cutting blade 75 of a cutting apparatus 70 illustrated in FIG. 16 along the laser processed grooves 7-2, after the laser processed groove forming step ST2 is carried out but before the protective member adhering step ST4 is performed.

In the groove forming step ST10, after the protective film cleaning step ST3 is carried out, the cutting apparatus 70 holds under suction a back surface 6 side of the wafer 1 on a holding surface 72 of a chuck table 71, as depicted in FIG. 16. Note that, in the second embodiment, of the cutting blade 75 mounted to a tip of a spindle 74 of a cutting unit 73 of the cutting apparatus 70, a tip of a cutting edge 76 is formed to be flat along an axis of the spindle 74.

In the groove forming step ST10, after the back surface 6 side is held under suction on the holding surface 72, an imaging unit (not illustrated) of the cutting apparatus 70 images the front surface 4 of the wafer 1 to detect the division lines 3, and alignment between the wafer 1 and the cutting blade 75 of the cutting unit 73 is performed.

In the groove forming step ST10, the cutting apparatus 70 positions a lower end of the cutting edge 76 of the cutting blade 75 rotated around an axis by the spindle 74 at such a height exceeding the finished thickness 100 but not reaching the back surface 6, then relatively moves the wafer 1 and the cutting blade 75 of the cutting unit 73 in a horizontal direction along the division line 3. In the groove forming step ST10, the cutting apparatus 70 relatively moves the wafer 1 and the cutting blade 75 of the cutting unit 73 in the horizontal direction along the division line 3, to cause the cutting blade 75 to cut into the bottom of the laser processed groove 7-2, thereby forming in the bottom of the laser processed groove 7-2 a cut groove 8 having such a depth not reaching the back surface 6 side of the wafer 1.

When the cutting blade 75 has been caused to cut into the bottoms of the laser processed grooves 7-2 at all the division lines 3 of the wafer 1 to form the cut grooves 8, the method of manufacturing the device chip proceeds to the protective member adhering step ST4.

In addition, in the grinding step ST5 of the method of manufacturing the device chip according to the second embodiment, a grinding apparatus 60 grinds the wafer 1 until the cut grooves 8 are exposed to the back surface 6, thereby dividing the wafer 1 into device chips 10-2 illustrated in FIGS. 17 and 18.

Note that, as illustrated in FIGS. 17 and 18, the device chip 10-2 manufactured by the method of manufacturing the device chip according to the second embodiment is formed with, in addition to inclined surfaces 12 at outside surfaces 11 thereof, vertical surfaces 13 continuous with the inclined surfaces 12. The vertical surface 13 is located on the back surface 6 side as compared to the inclined surface 12, and is an inner surface of the cut groove 8 formed in the groove forming step ST10.

In the laser processed groove forming step ST2 in the method of manufacturing the device chip according to the second embodiment, a pulsed laser beam 41 is applied while being scanned in a width direction 45 of each division line 3, to form a sectionally V-shaped laser processed groove 7-2. Therefore, die strength of the device chips 10 can be enhanced, as in the first embodiment.

Note that, in the second embodiment, the groove forming step ST10 is conducted after the protective film cleaning step ST3, but, in the present invention, protective film cleaning may be performed simultaneously with a swarf cleaning step which is carried out before the protective film cleaning step ST3 and after the groove forming step ST10, insofar as it is performed after the laser processed groove forming step ST2. Besides, in the method of manufacturing the device chip according to the second embodiment, the inclined surface 12 may be an inclined surface 12-1 curved to be protuberant toward the outside, as in the modification of the first embodiment.

Third Embodiment

Figure 19:
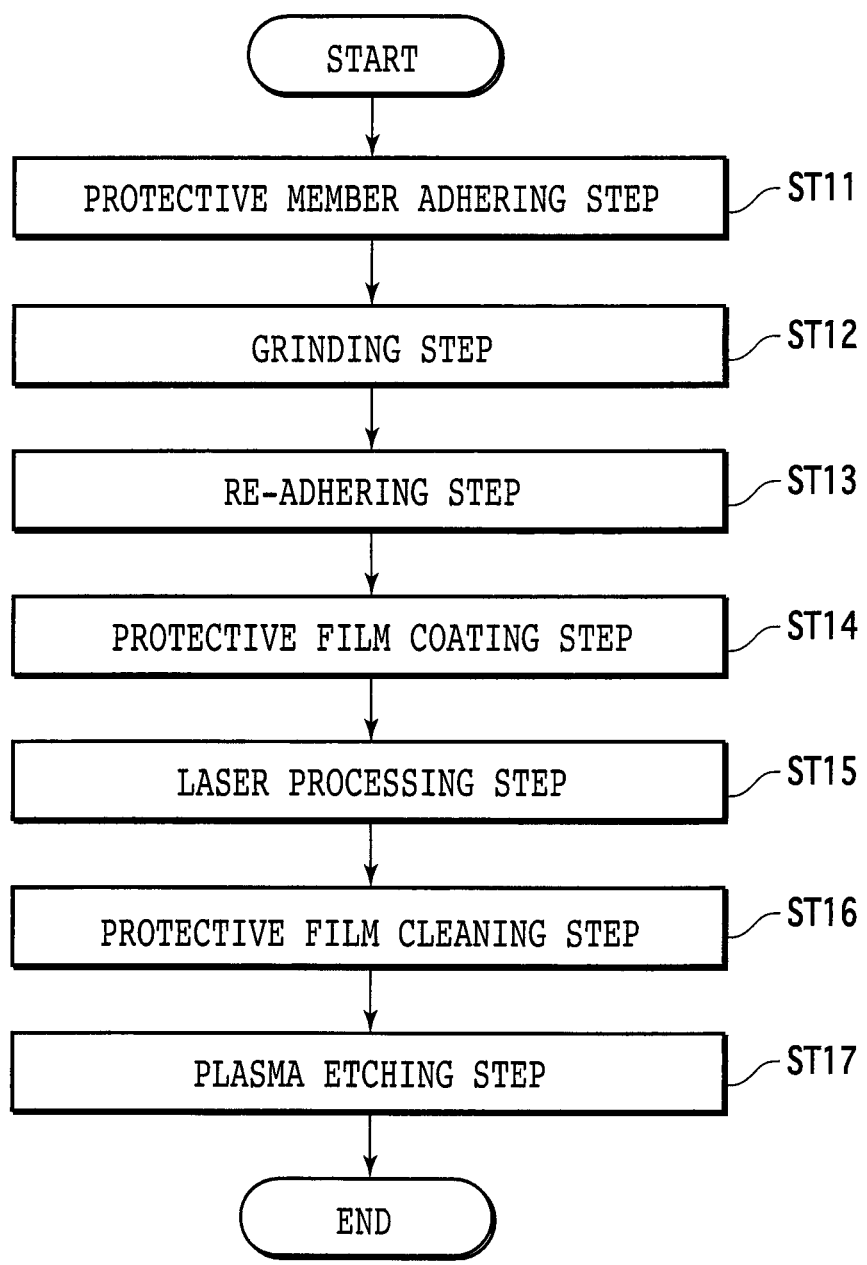
FIG. 19 is a flow chart depicting the flow of a method of manufacturing a device chip according to a third embodiment.

A method of manufacturing a device chip according to a third embodiment of the present invention will be described referring to the drawings. FIG. 19 is a flow chart depicting the flow of the method of manufacturing the device chip according to the third embodiment. Herein, in the description of the third embodiment, the same parts as those in the first embodiment above are denoted by the same reference symbols as used above, and descriptions thereof are omitted.

The method of manufacturing the device chip according to the third embodiment is a method in which, after a wafer 1 is thinned to a predetermined finished thickness 100, the wafer 1 is divided along division lines 3 into individual device chips 10-3. As depicted in FIG. 19, the method of manufacturing the device chip according to the third embodiment includes a protective member adhering step ST11, a grinding step ST12, a re-adhering step ST13, a protective film coating step ST14, a laser processing step ST15, a protective film cleaning step ST16, and a plasma etching step ST17.

(Protective Member Adhering Step)

Figure 20:
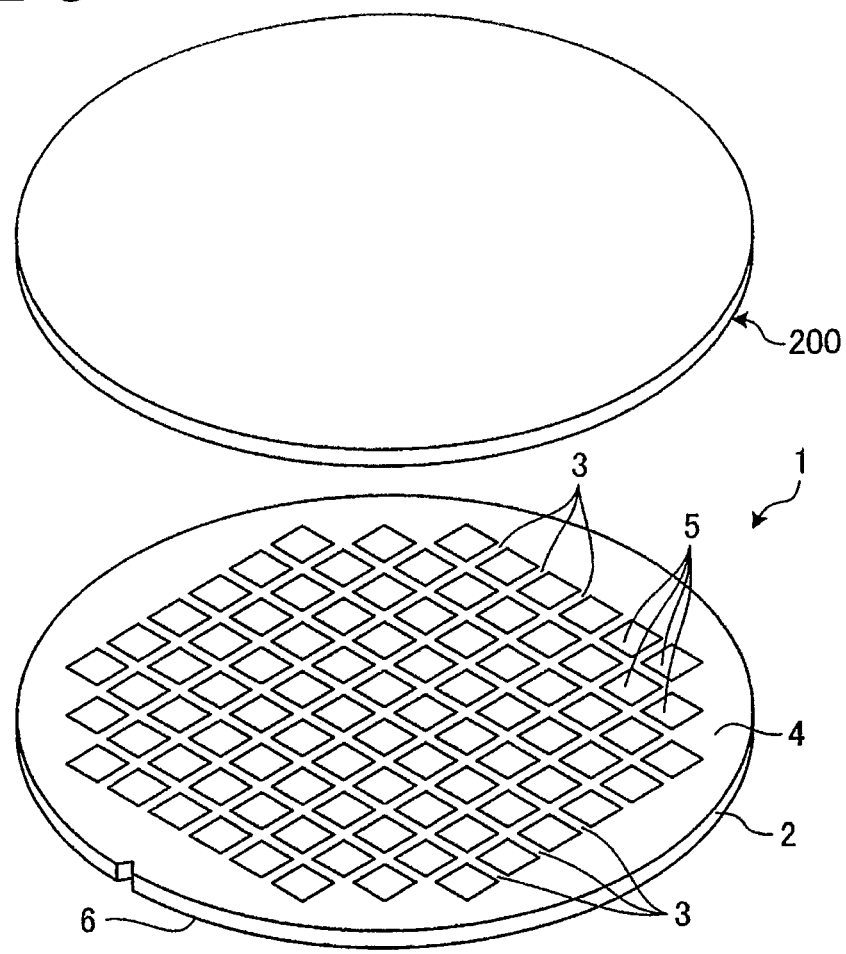
FIG. 20 is a perspective view illustrating a state in which an adhesive layer of an adhesive tape is made to face a front surface of a wafer, in a protective member adhering step of the method of manufacturing the device chip depicted in FIG. 19.
Figure 21:
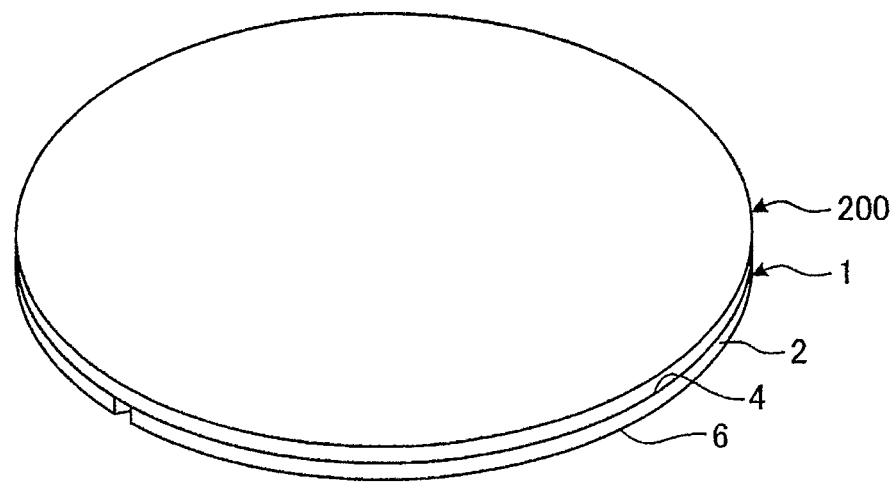
FIG. 21 is a perspective view illustrating a state in which the adhesive tape has been adhered to the front surface of the wafer, in the protective member adhering step of the method of manufacturing the device chip depicted in FIG. 19.

FIG. 20 is a perspective view illustrating a state in which an adhesive layer of an adhesive tape is made to face a front surface of a wafer, in the protective member adhering step of the method of manufacturing the device chip depicted in FIG. 19. FIG. 21 is a perspective view illustrating a state in which the adhesive tape has been adhered to the front surface of the wafer, in the protective member adhering step of the method of manufacturing the device chip depicted in FIG. 19.

The protective member adhering step ST11 is a step of adhering the adhesive tape 200, which is a protective member, to the front surface 4 of the wafer 1 illustrated in FIG. 20. In the protective member adhering step ST11 in the third embodiment, the adhesive tape 200 equal in diameter with the wafer 1 is adhered to the front surface 4 of the wafer 1, as illustrated in FIG. 21. In the third embodiment, the adhesive tape 200 is used as the protective member, but, in the present invention, the protective member is not limited to the adhesive tape 200. When the adhesive tape 200 has been adhered to the front surface 4 of the wafer 1, the method of manufacturing the device chip proceeds to the grinding step ST12.

(Grinding Step)

Figure 22:
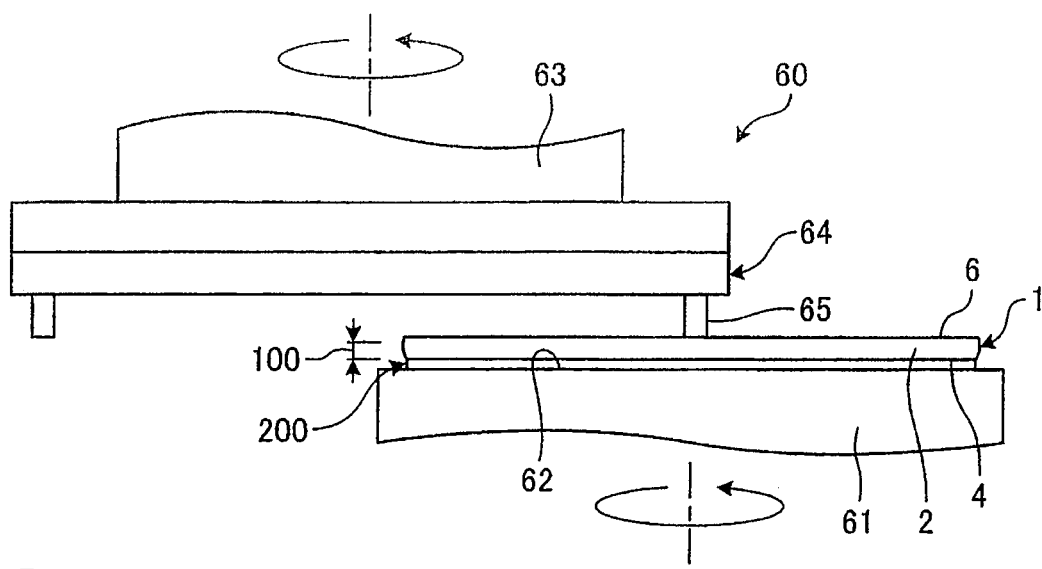
FIG. 22 is a side view depicting a grinding step of the method of manufacturing the device chip depicted in FIG. 19.

FIG. 22 is a side view depicting the grinding step of the method of manufacturing the device chip depicted in FIG. 19. The grinding step ST12 is a step of grinding the wafer 1 with the adhesive tape 200 adhered thereto from a back surface 6 side, to thin the wafer 1 to a finished thickness 100.

In the grinding step ST12, a grinding apparatus 60 holds under suction the front surface 4 side of the wafer 1 on a holding surface 62 of a chuck table 61, with the adhesive tape 200 interposed therebetween. In the grinding step ST12, as illustrated in FIG. 22, the grinding apparatus 60 supplies grinding water while rotating a grinding wheel 64 by a spindle 63 and rotating the chuck table 61 around an axis, and brings a grindstone 65 of the grinding wheel 64 closer to the chuck table 61 at a predetermined feed speed, whereby the grindstone 65 grinds the back surface 6 side of the wafer 1. In the grinding step ST12, the grinding apparatus 60 grinds the wafer 1 until the finished thickness 100 is reached. When the wafer 1 has been thinned to the finished thickness 100, the method of manufacturing the device chip proceeds to the re-adhering step ST13.

(Re-Adhering Step)

Figure 23:
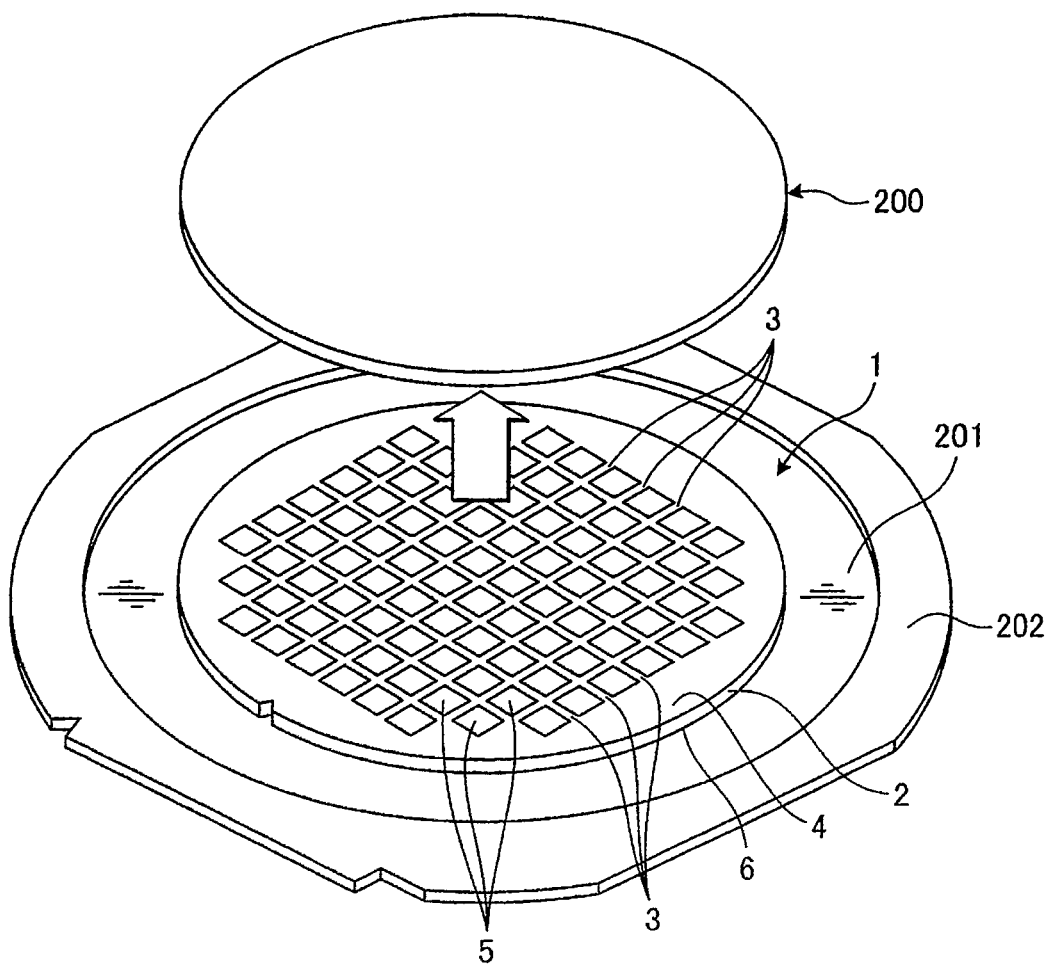
FIG. 23 is a perspective view illustrating a re-adhering step of the method of manufacturing the device chip depicted in FIG. 19.

FIG. 23 is a perspective view depicting the re-adhering step of the method of manufacturing the device chip depicted in FIG. 19. The re-adhering step ST13 is a step in which a dicing tape 201 as a protective member is adhered to the back surface 6 side of the wafer 1, and the adhesive tape 200 is peeled off from the front surface 4 side of the wafer 1.

In the re-adhering step ST13, the dicing tape 201 with an annular frame 202 adhered to an outer peripheral edge thereof is adhered to the back surface 6 of the wafer 1 ground in the grinding step ST12, and the adhesive tape 200 is peeled off from the front surface 4 side, as illustrated in FIG. 23. When the adhesive tape 200 has been peeled off from the front surface 4 side, the method of manufacturing the device chip proceeds to the protective film coating step ST14.

(Protective Film Coating Step)

Figure 24:
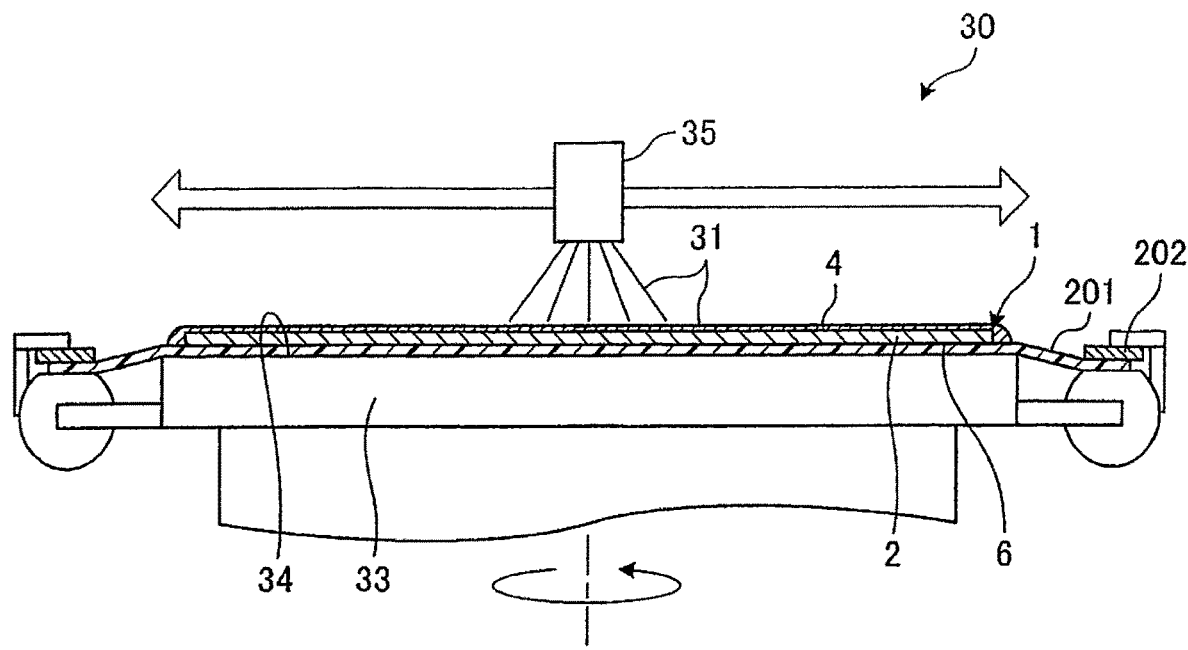
FIG. 24 is a side view depicting, partly in section, a protective film coating step of the method of manufacturing the device chip depicted in FIG. 19.

FIG. 24 is a side view depicting, partly in section, the protective film coating step of the method of manufacturing the device chip depicted in FIG. 19. The protective film coating step ST14 is a step in which a water-soluble resin 31 is supplied to the front surface 4 of the wafer 1 before the laser processing step ST15, to coat the front surface 4 of the wafer 1 with a water-soluble protective film 32 (depicted in FIG. 25) formed of the cured water-soluble resin 31.

In the protective film coating step ST14, as illustrated in FIG. 24, a protective film coating apparatus 30 holds under suction the back surface 6 side of the wafer 1 on a holding surface 34 of a spinner table 33, with the dicing tape 201 interposed therebetween, and applies a liquid water-soluble resin 31 to the front surface 4 side of the wafer 1 from an applying nozzle 35 which is moved over the wafer 1 along the front surface 4 while rotating the spinner table 33 around an axis. The water-soluble resin 31 applied to the front surface 4 of the wafer 1 is spread toward the outer edge side of the wafer 1 by a centrifugal force generated by the rotation of the spinner table 33, to coat the whole part of the front surface 4 of the wafer 1.

In the protective film coating step ST14, the protective film coating apparatus 30, after applying the water-soluble resin 31 to the front surface 4 side of the wafer 1, dries or heats the water-soluble resin 31 to cure the water-soluble resin 31, thereby coating the whole part of the front surface 4 of the wafer 1 with the water-soluble protective film 32. When the whole part of the front surface 4 of the wafer 1 has been coated with the water-soluble protective film 32, the method of manufacturing the device chip proceeds to the laser processing step ST15.

(Laser Processing Step)

Figure 25:
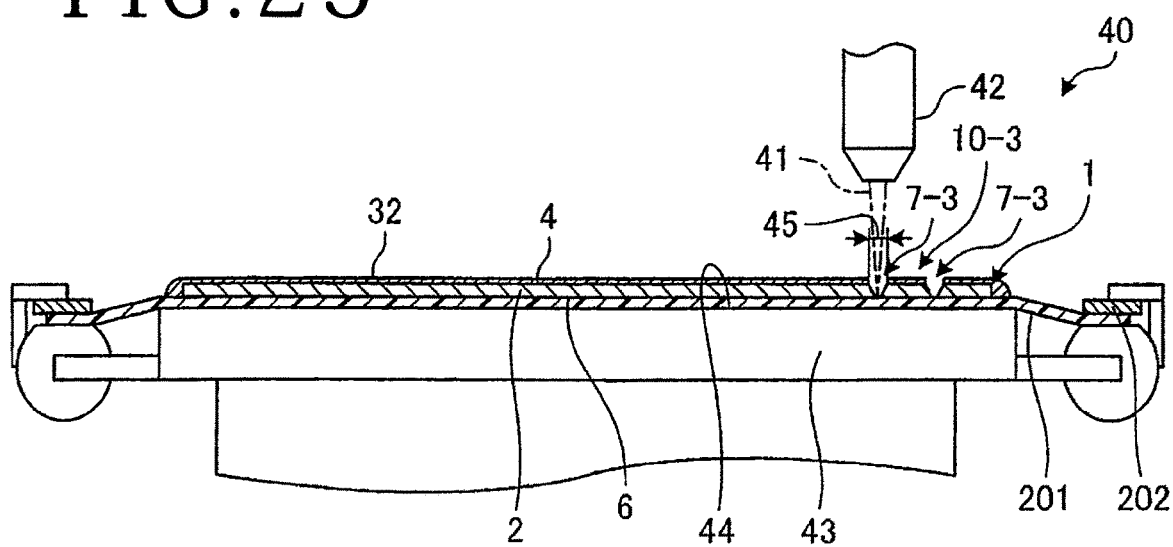
FIG. 25 is a side view depicting, partly in section, a laser processing step of the method of manufacturing the device chip depicted in FIG. 19.

FIG. 25 is a side view depicting, partly in section, the laser processing step of the method of manufacturing the device chip depicted in FIG. 19. The laser processing step ST15 is a step in which, after the grinding step ST12 is carried out, a laser beam 41 of such a wavelength as to be absorbed in the wafer 1 is applied along the division lines 3 from the front surface 4 side of the wafer 1, to form V-shaped laser processed grooves 7-3 along the division lines 3, the laser processed grooves 7-3 becoming shallower toward outer sides in the width direction thereof. Besides, the laser processing step ST15 is a step of dividing the wafer 1 along the division lines 3 by the laser processed grooves 7-3 to form device chips 10-3 having inclined surfaces 12 at outside surfaces 11 thereof.

In the laser processing step ST15, a laser processing apparatus 40 holds under suction the back surface 6 side of the wafer 1 on a holding surface 44 of a chuck table 43, with the dicing tape 201 interposed therebetween, as illustrated in FIG. 25. In the laser processing step ST15, an imaging unit (not illustrated) of the laser processing apparatus 40 images the front surface 4 of the wafer 1 to detect the division lines 3, and alignment between the wafer 1 and a laser beam applying unit 42 is performed.

In the laser processing step ST15, the laser processing apparatus 40 applies a pulsed laser beam 41 of such a wavelength as to be absorbed in the wafer 1 toward the division line 3 while moving the laser beam applying unit 42 along the division line 3 relatively to the chuck table 43. Besides, in the laser processing step ST15 in the third embodiment, the laser processing apparatus 40 scans the laser beam 41 in the width direction 45 of each division line 3, at the time of applying the laser beam 41 from the laser beam applying unit 42 while moving the laser beam applying unit 42 along the division line 3 relatively to the chuck table 43.

In the laser processing step ST15, as depicted in FIG. 25, the laser processing apparatus 40 subjects the division lines 3 on the front surface 4 of the wafer 1 to ablation, to form laser processed grooves 7-3 along the division lines 3. Debris (not illustrated) is generated upon ablation adheres to the water-soluble protective film 32. Besides, in the laser processing step ST15 in the third embodiment, the laser processing apparatus 40 forms the laser processed grooves 7-3 penetrating the wafer 1, to divide the wafer 1 into individual device chips 10-3 by the laser processed grooves 7-3.

In addition, in the laser processing step ST15 in the third embodiment, the laser processing apparatus 40 applies the pulsed laser beam 41 along the longitudinal direction of each division line 3 while scanning the laser beam 41 in the width direction 45 of each division line 3, to form the laser processed grooves 7-3 along the division lines 3. In this instance, the pulses of the laser beam 41 are applied in the largest number to the center in the width direction of each division line 3, and the number of pulses of the laser beam 41 to be applied is decreased toward outer sides in the width direction of each division line 3. For this reason, in the laser processing step ST15 in the third embodiment, the sectionally V-shaped laser processed grooves 7-3 each becoming shallower toward the outer sides in the width direction of each division line 3 are formed.

Note that, in the third embodiment, inner surfaces of the laser processed grooves 7-3 are formed to be flat, but, in the present invention, the inner surfaces may not be flat. When the laser processed grooves 7-3 have been formed along all the division lines 3 of the wafer 1, the method of manufacturing the device chip proceeds to the protective film cleaning step ST3.

Besides, in the laser processing step ST15 in the third embodiment, the sectionally V-shaped laser processed grooves 7-3 having the flat inner surfaces are formed, and, therefore, the device chips 10-3 has, at outside surfaces 11 thereof, flat inclined surfaces 12 such that the device chip 10-3 is gradually enlarged in going from the front surface 4 toward the back surface 6.

(Protective Film Cleaning Step)

Figure 26:
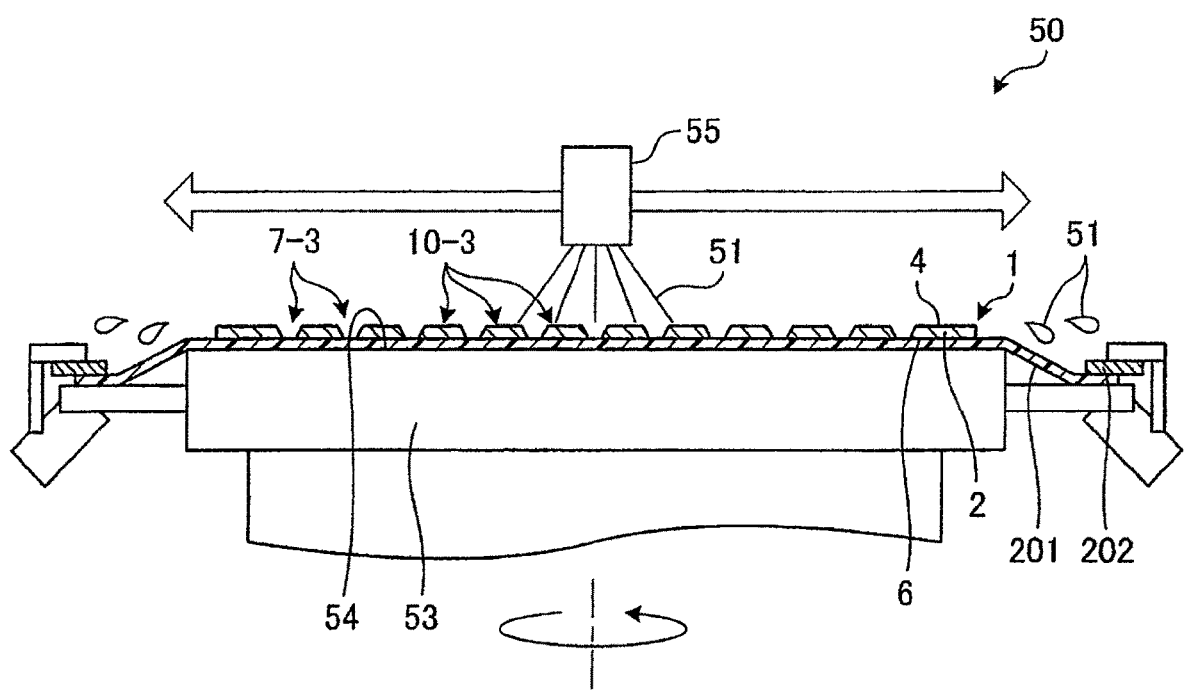
FIG. 26 is a side view depicting, partly in section, a protective film cleaning step of the method of manufacturing the device chip depicted in FIG. 19.

FIG. 26 is a side view depicting, partly in section, the protective film cleaning step of the method of manufacturing the device chip depicted in FIG. 19. The protective film cleaning step ST16 is a step in which, after the laser processing step ST15 is carried out, cleaning water 51 including pure water is supplied to the front surface 4 of the wafer 1, and the water-soluble protective film 32 is removed together with debris generated upon ablation.

In the protective film cleaning step ST16, as illustrated in FIG. 26, a cleaning apparatus 50 holds under suction the back surface 6 side of the plurality of device chips 10-3 on a holding surface 54 of a spinner table 53, with the dicing tape 201 interposed therebetween, rotates the spinner table 53 around an axis, and jets the cleaning water 51 toward the front surfaces 4 of the device chips 10-3 from a cleaning water nozzle 55 which is moved over the device chips 10-3 along the front surfaces 4. In the protective film cleaning step ST16, the cleaning water 51 smoothly flows on the front surfaces 4 of the device chips 10-3 due to a centrifugal force generated by the rotation of the spinner table 53, to wash away and remove the debris adhering to the water-soluble protective film 32 together with the water-soluble protective film 32. In the protective film cleaning step ST16, the cleaning apparatus 50 supplies the cleaning water 51 to the front surfaces 4 of the device chips 10-3 while rotating the spinner table 53, for a predetermined period of time, whereon cleaning of the device chips 10-3 is finished, and the device chips 10-3 are dried. When drying of the front surfaces 4 of the device chips 10-3 has been finished, the method of manufacturing the device chip proceeds to the plasma etching step ST17.

Note that, in the third embodiment, the protective film coating step ST1 is conducted by the protective film coating apparatus 30 and the protective film cleaning step ST16 is performed by the cleaning apparatus 50 different from the protective film coating apparatus 30, but, in the present invention, the protective film coating step ST1 and the protective film cleaning step ST16 may be carried out by a single apparatus provided with the nozzles 35 and 55.
(Plasma Etching Step)

Figure 27:
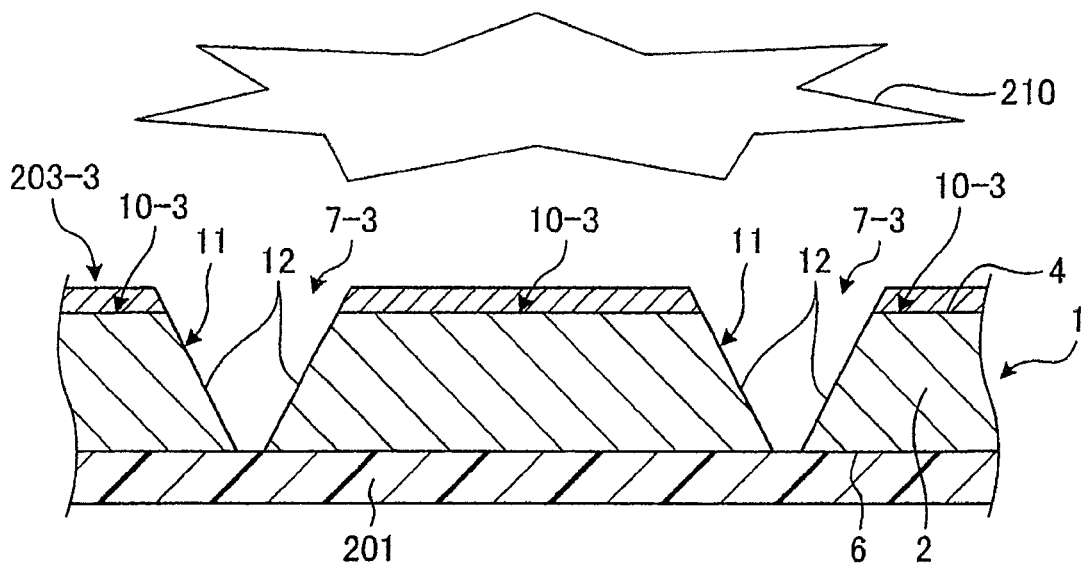
FIG. 27 is a side view of a major part of a wafer, depicting schematically a plasma etching step of the method of manufacturing the device chip depicted in FIG. 19.
Figure 28:
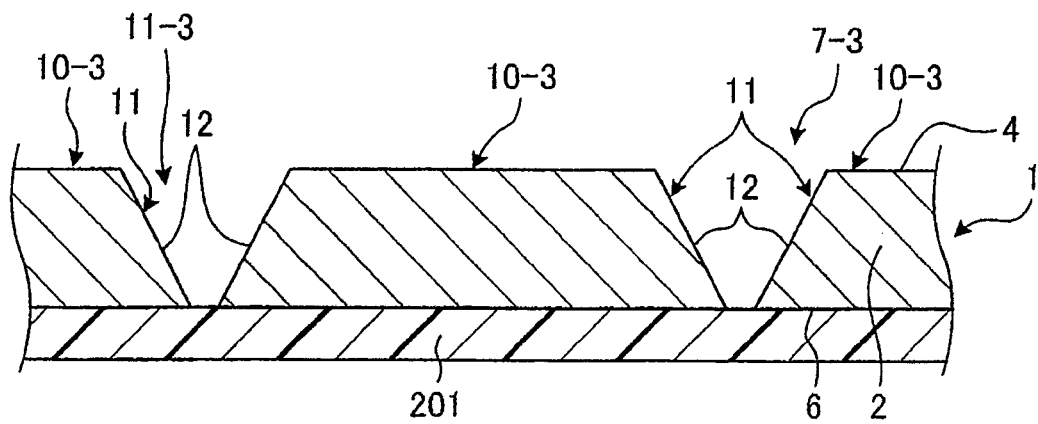
FIG. 28 is a side view of a major part of the wafer after the plasma etching step of the method of manufacturing the device chip depicted in FIG. 19.

FIG. 27 is a sectional view of a major part of a wafer, depicting schematically the plasma etching step of the method of manufacturing the device chip depicted in FIG. 19. FIG. 28 is a sectional view of a major part of the wafer after the plasma etching step of the method of manufacturing the device chip depicted in FIG. 19.

The plasma etching step ST17 is a step in which, after the laser processing step ST15 is carried out, the plurality of device chips 10-3 held by the dicing tape 201 are subjected to plasma etching. In the plasma etching step ST17, a mask 203-3 covering devices 5 and exposing outside surfaces 11 of the device chips 10-3 and the like is formed on the front surface 4 side. In the plasma etching step ST17 in this embodiment, the mask 203-3 is formed of a water-soluble resin 31 similar to the water-soluble protective film 32, but, in the present invention, the material constituting the mask 203-3 is not limited to the water-soluble resin 31. For example, a passivation film covering the devices 5 may be utilized as the mask 203-3.

In the plasma etching step ST17, the plurality of device chips 10-3 held by the dicing tape 201 are accommodated in an etching chamber of a plasma apparatus (not illustrated), and the back surface 6 side of the device chips 10-3 is electrostatically attracted to an electrostatic chuck table, with the dicing tape 201 interposed therebetween. In the plasma etching step ST17, as illustrated in FIG. 27, plasmatized gas is supplied into the etching chamber of an etching apparatus, whereby plasmatized etching gas 210 is supplied to the front surface 4 side of the device chips 10-3.

Note that, in the plasma etching step ST17 in the third embodiment, an etching apparatus of the remote plasma system is used as in the plasma etching step ST6 in the first embodiment, but, in the present invention, an etching apparatus of the direct plasma system may be used. Besides, in the third embodiment, in a case where the substrate 2 is configured using silicon, there is used $SF_6$, $C_4F_8$, $CF_4$, or the like as the etching gas, as in the first embodiment, but the etching gas is not limited to these.

In the plasma etching step ST17, the etching apparatus subjects the device chips 10-3 to plasma etching for a predetermined period of time for removing thermally influenced layers generated in the wafer 1, i.e., in the device chips 10-3, in the laser processing step ST15. In the plasma etching step ST17, the device chips 10-3 are subjected to plasma etching for the predetermined period of time, after which the mask 203-3 is removed. When the plasma etching of the device chips 10-3 and the like have been conducted, the method of manufacturing the device chip is finished. Note that, thereafter, the device chips 10-3 are picked up from the dicing tape 201 by a pick-up device (not illustrated).

In the laser processing step ST15 in the method of manufacturing the device chip according to the third embodiment, the pulsed laser beam 41 is applied while scanning it in the width direction 45 of each division line 3, to form sectionally V-shaped laser processed grooves 7-3, thereby forming the inclined surfaces 12 at the outside surfaces 11 of the device chips 10-3. This chip shape makes it possible to enhance die strength of the device chips 10-3. Further, since chipping is not generated in the laser processing, the die strength can be enhanced.

Note that, in the method of manufacturing the device chip according to the third embodiment, the inclined surfaces 12-1 curved to be protuberant toward the outside may be formed, as in the modification of the first embodiment. In addition, in the method of manufacturing the device chip according to the third embodiment, the plasma etching step ST17 may be carried out after the laser processing step ST15, and the protective film cleaning step ST16 may be performed after the plasma etching step ST17. In this case, the water-soluble protective film 32 for laser processing can be used as the mask for plasma etching.
(Modifications)

Figure 29:
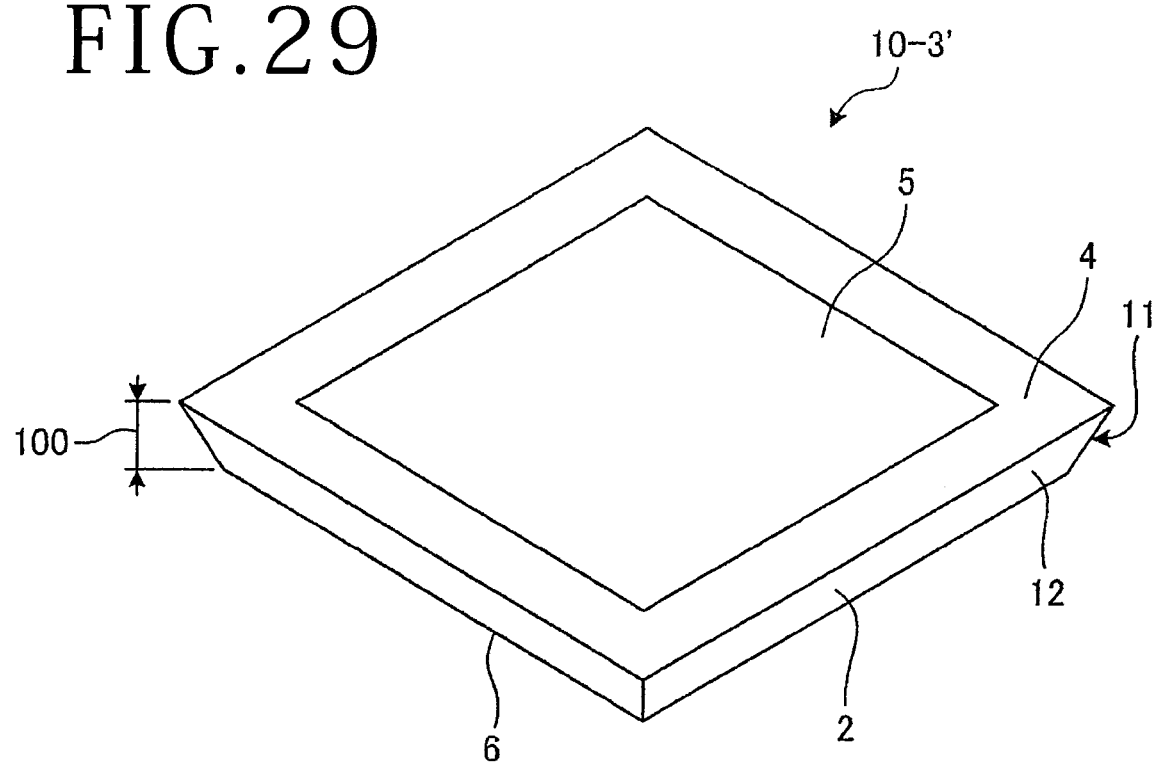
FIG. 29 is a perspective view of a device chip manufactured by a method of manufacturing a device chip according to a first modification of the third embodiment.
Figure 30:
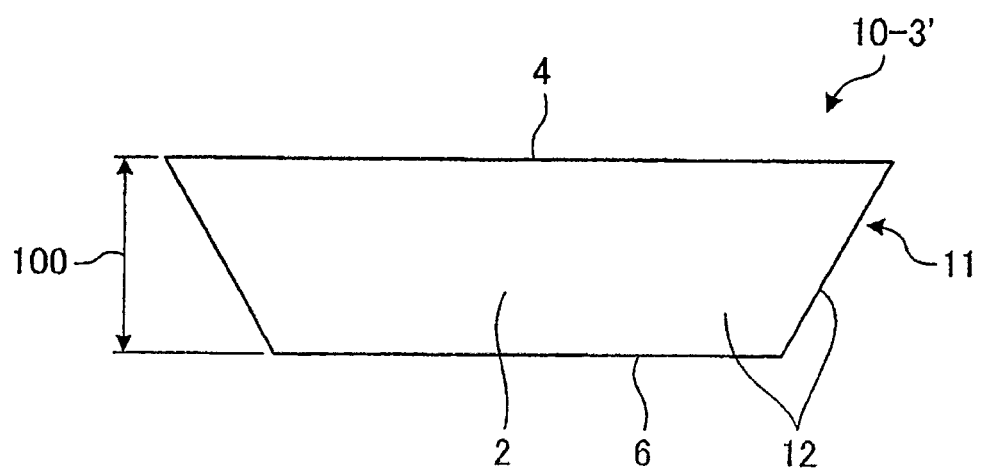
FIG. 30 is a side view of the device chip depicted in FIG. 29.
Figure 31:
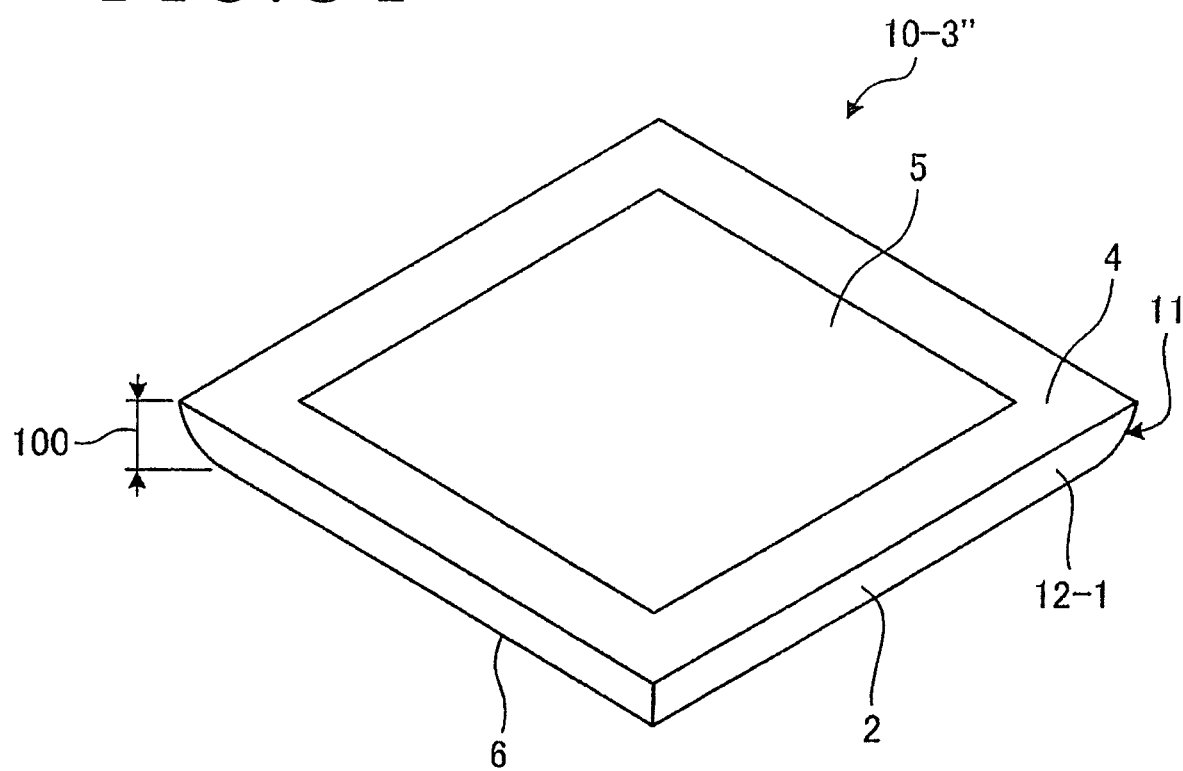
FIG. 31 is a perspective view of a device chip manufactured by a method of manufacturing a device chip according to a second modification of the third embodiment.
Figure 32:
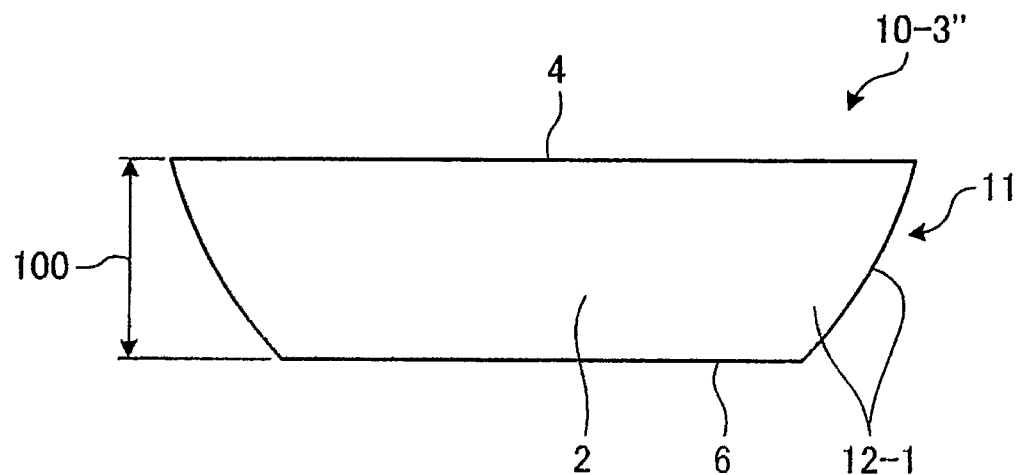
FIG. 32 is a side view of the device chip depicted in FIG. 31.
Figure 33:
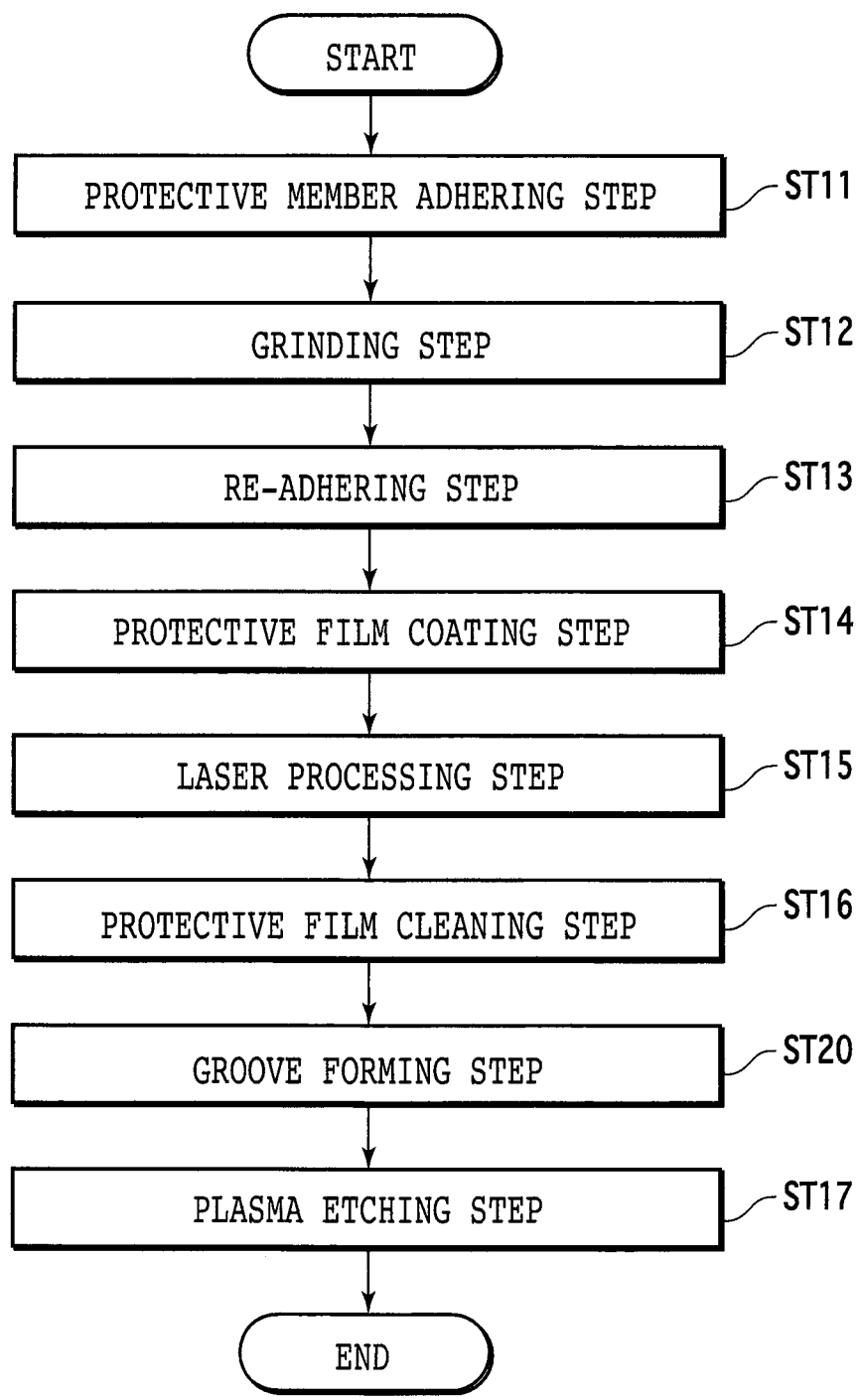
FIG. 33 is a flow chart depicting the flow of a method of manufacturing a device chip according to a third modification of the third embodiment.
Figure 34:
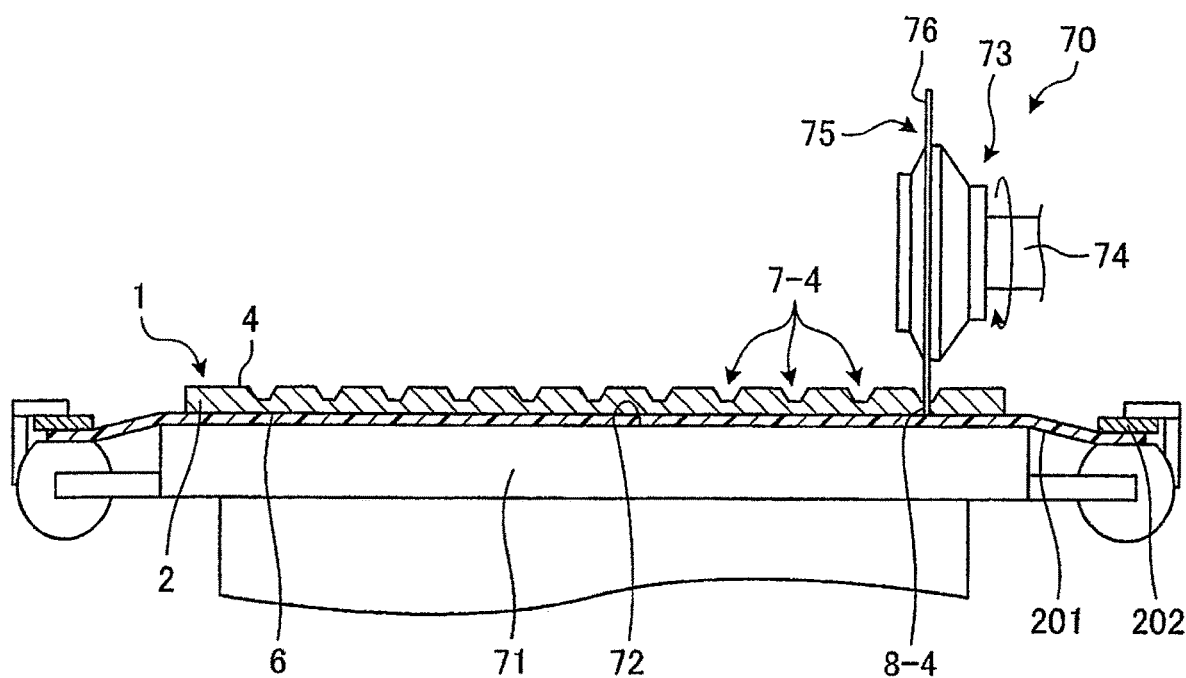
FIG. 34 is a side view depicting, partly in section, a groove forming step of the method of manufacturing the device chip depicted in FIG. 33.

Methods of manufacturing a device chip according to modifications of the third embodiment of the present invention will be described referring to the drawings. FIG. 29 is a perspective view of a device chip manufactured by a method of manufacturing a device chip according to a first modification of the third embodiment. FIG. 30 is a side view of the device chip illustrated in FIG. 29. FIG. 31 is a perspective view of a device chip manufactured by a method of manufacturing a device chip according to a second modification of the third embodiment. FIG. 32 is a side view of the device chip depicted in FIG. 31. FIG. 33 is a flow chart depicting the flow of a method of manufacturing a device chip according to a third modification of the third embodiment. FIG. 34 is a side view depicting, partly in section, a groove forming step in the method of manufacturing the device chip depicted in FIG. 33. Note that in FIGS. 29 to 34, the same parts as those in the third embodiment and the like above are denoted by the same reference symbols as used above, and descriptions thereof are omitted.

In a laser processing step ST15 in the methods of manufacturing the device chip according to the first modification and the second modification of the third embodiment, a laser beam 41 is applied from a back surface 6 side of a wafer 1 along division lines 3, whereby, as illustrated in FIGS. 29, 30, 31, and 32, inclined surfaces 12 and 12-1 are formed at outside surfaces 11 of the device chips 10-3' and 10-3" such that devices 5 are reduced in going from front surfaces 4 to back surfaces 6. Note that, in the first modification illustrated in FIGS. 29 and 30, the flat inclined surfaces 12 are formed, whereas in the second modification depicted in FIGS. 31 and 32, the inclined surfaces 12-1 curved to be protuberant toward the outside are formed.

In addition, in the methods of manufacturing the device chip according to the first modification and the second modification of the third embodiment, a re-adhering step ST13, a protective film coating step ST14, and a protective film cleaning step ST16 are not conducted, and the methods proceed to a laser processing step ST15 after a grinding step ST12. In the laser processing step ST15, a laser processing apparatus 40 holds the front surface 4 side of the wafer 1 on a holding surface 44 of a chuck table 43, with an adhesive tape 200 interposed therebetween, and applies the laser beam 41 from the back surface 6 of the wafer 1, to form later processed grooves 7-3, thereby dividing the wafer 1 into the device chips 10-3' and 10-3". After the laser processing step ST15, the methods of manufacturing the device chip according to the first modification and the second modification of the third embodiment proceed to a plasma etching step ST17, in which the device chips 10-3' and 10-3" are subjected to plasma etching from the back surface 6 side. Besides, in the methods of manufacturing the device chip according to the first modification and the second modification of the third embodiment, the protective film coating step ST14 may be conducted before the laser processing step ST15, and a water-soluble protective film 32 may be removed after the laser processing step ST15 or after the plasma etching step ST17.

A method of manufacturing a device chip according to a third modification of the third embodiment is the same as the third embodiment, except that, as depicted in FIG. 33, after the laser processing step ST15 and the protective film cleaning step ST16 are carried out, a groove forming step ST20 of forming cut grooves 8-4 for dividing the wafer 1 by a cutting blade 75 depicted in FIG. 34 along the laser processed grooves 7-4 is provided, whereby the device chips 10-2 according to the second embodiment are manufactured.

In the method of manufacturing the device chip according to the third modification of the third embodiment, the laser processed grooves 7-4 having a depth in excess of the finished thickness 100 of the device chips 10-2 are not formed in the laser processing step ST15, but the cut grooves 8-4 are further formed by the cutting blade 75 in the laser processed grooves 7-4 in the groove forming step ST20, thereby dividing the wafer 1 into the device chips 10-2. Note that, in the method of manufacturing the device chip according to the third modification of the third embodiment, the inclined surfaces 12 may be the inclined surfaces 12-1 curved to be protuberant toward the outside, as in the modification of the first embodiment. In addition, in the laser processing step ST15, the laser beam 41 may be applied from the back surface 6 side of the wafer 1, to form the inclined surfaces 12 and 12-1 at the outside surfaces 11 of the device chips 10-2 such that the device 5 is gradually reduced in going from the front surface 4 toward the back surface 6.

In the methods of manufacturing the device chip according to the first modification, the second modification, and the third modification, the sectionally V-shaped laser processed grooves 7-3 and 7-4 are formed in the laser processing step ST15, and, therefore, die strengths of the device chips 10-2, 10-3', and 10-3" can be enhanced, as in the third embodiment.

In addition, in the methods of manufacturing the device chip according to the first modification and the second modification, the laser beam 41 is applied from the back surface 6 side of the wafer 1 in the laser processing step ST15, and, therefore, it is unnecessary to carry out the re-adhering step ST13. As a result, in the methods of manufacturing the device chip according to the first modification and the second modification, the number of steps required can be suppressed.

Next, the present inventor has confirmed the effect of the method of manufacturing the device chip of the present invention. In the confirmation, die strength was measured for Comparative Example, Invention Product 1, and Invention Product 2. The results are set forth in Table 1 below.

TABLE 1

|  | Die strength |
| --- | --- |
| Comparative Example | 1,000 MPa |
| Invention Product 1 | 1,400 MPa |
| Invention Product 2 | 1,400 MPa |

Note that Comparative Example in Table 1 is a device chip divided from the wafer 1 by use of a cutting blade whose tip of a cutting edge is flat along the axis. Invention Product 1 is a device chip 10-2 which is manufactured by the method of manufacturing the device chip according to the second embodiment, and in which the angle θ (depicted in FIG. 18) of the inclined surface 12 relative to the front surface 4 and the back surface 6 is 40 degrees. Invention Product 2 is a device chip 10-2 which is manufactured by the method of manufacturing the device chip according to the second embodiment, and in which the angle θ (depicted in FIG. 18) of the inclined surface 12 relative to the front surface 4 and the back surface 6 is 70 degrees.

As seen from Table 1, the die strength of Comparative Example was 1,000 MPa, whereas the die strengths of Invention Product 1 and Invention Product 2 were 1,400 MPa. Therefore, according to Table 1, it has been verified that by forming the inclined surfaces 12 and 12-1 at the outside surfaces 11 of the device chips 10, the die strengths of the device chips 10, 10', 10-2, 10-3, 10-3', and 10-3" can be enhanced as compared to Comparative Example.

In addition, according to Table 1, it has been verified that the die strengths of the device chips 10, 10', 10-2, 10-3, 10-3', and 10-3" can be enhanced as compared to Comparative Example, by setting the angle of the inclined surfaces 12, 12-1, 12-2, and 12-3 formed at the outside surfaces 11 of the device chips 10 to a value in the range from 40 degrees to 70 degrees.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a device chip, the method comprising:
    a laser processed groove forming step of applying, from a front surface of a wafer formed with devices in a plurality of regions of the front surface partitioned by a plurality of crossing division lines, a laser beam of such a wavelength as to be absorbed in the wafer along the division lines, to form V-shaped laser processed grooves along the division lines, the laser processed grooves becoming shallower toward outer sides in a width direction;
    a protective member adhering step of adhering a protective member to the front surface of the wafer formed with the laser processed grooves; and
    a grinding step of grinding the wafer held by a chuck table, with the protective member interposed therebetween, from a back surface of the wafer, to divide the wafer while thinning the wafer to a finished thickness, thereby forming a plurality of device chips having inclined surfaces at side surfaces thereof,
    wherein during said laser processed groove forming step, the laser beam is moved relative to the wafer along a longitudinal direction of the division line while also being scanned in the width direction of the division line, whereby the laser beam is relatively moved in two different directions while forming each of said V-shaped laser processed grooves.

2. The method of manufacturing the device chip according to claim 1, further comprising:
a plasma etching step of plasma etching the device chips held by the protective member, after the grinding step is carried out.

3. The method of manufacturing the device chip according to claim 1, wherein, while scanning the laser beam in the width direction of the division line, a larger number of pulses of the laser beam are applied near the center of the width direction than applied towards the outer sides of the width direction.

4. The method of manufacturing the device chip according to claim 1, wherein the scanning in the width direction is performed by moving a polygon mirror.

5. The method of manufacturing the device chip according to claim 1, wherein the scanning in the width direction is performed via a Galvano scanner.

* * * * *